(12) United States Patent
Shiratake et al.

(10) Patent No.: US 6,743,692 B2
(45) Date of Patent: Jun. 1, 2004

(54) SEMICONDUCTOR DEVICE MANUFACTURING METHOD

(75) Inventors: Shigeru Shiratake, Tokyo (JP); Masahiko Takeuchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/384,589

(22) Filed: Mar. 11, 2003

(65) Prior Publication Data

US 2004/0063313 A1 Apr. 1, 2004

(30) Foreign Application Priority Data

Sep. 26, 2002 (JP) ....................................... 2002-280238

(51) Int. Cl.[7] ............................................. H01L 21/20
(52) U.S. Cl. ........................ 438/381; 438/197; 438/680
(58) Field of Search ................................ 438/197, 239, 438/243, 253, 299–301, 393, 396, 381, 386, 680, 689, 692, 706, 735, 740, 637, 672, 675

(56) References Cited

U.S. PATENT DOCUMENTS 5,275,960 A  *  1/1994  Yamaguchi et al. ........ 438/680
5,444,278 A  *  8/1995  Katayama ................... 257/296
6,225,180 B1 *  5/2001  Fujii .......................... 438/350
6,359,318 B1 *  3/2002  Yamamoto et al. ......... 257/378

FOREIGN PATENT DOCUMENTS

JP          6-37272      2/1994
JP          2001-44382   2/2001

* cited by examiner

*Primary Examiner*—David Nhu
(74) *Attorney, Agent, or Firm*—Oblon, Spivak, McClelland, Maier & Neustadt, P.C.

(57) ABSTRACT

It is an object to provide a technique for reducing an electric resistance between a contact plug and an impurity region to be electrically connected thereto while maintaining an insulating property between a gate electrode and the contact plug. A sidewall insulating film (17) is formed on a side surface of a gate structure (60) provided on a semiconductor substrate (1), and epitaxial layers (19a) and (19b) are formed in self-alignment on n-type impurity regions (13a) and (13b) so that the sidewall insulating film (17) lies between the epitaxial layers (19a) and (19b) and a gate electrode (50). An etching blocking film (20) and an interlayer insulating film (21) are formed over a whole surface in this order. Using the etching blocking film (20) as an etching stopper, the interlayer insulating film (21) is etched and the exposed etching blocking film (20) is subsequently etched. Consequently, contact holes (30a) and (30b) reaching the epitaxial layers (19a) and (19b) are formed.

5 Claims, 29 Drawing Sheets

SEMICONDUCTOR DEVICE MANUFACTURING METHOD

BACKGROUND OF THE INVENTION

1. Field of the Invention

The present invention relates to a method of manufacturing a semiconductor device, and more particularly to a method of manufacturing a semiconductor device having a self-alignment contact structure utilizing a selective epitaxial growth method.

2. Description of the Background Art

With an increase in a degree of integration of a semiconductor device, a wiring width has been reduced and a space width between wirings has also been decreased gradually. In order to form a contact hole to penetrate between the wirings, accordingly, a much finer pattern than the space width between the wirings in such a situation has been required.

In consideration of an overlay accuracy ($=\alpha$) and a dimensional accuracy ($=\beta$) of a photolithographic process, $C > 0.25 - f(\alpha, \beta) \mu m$ is required for a size C of a contact hole required in a design rule in which the space width between the wirings is set to be 0.25 $\mu$m. With an increase in the degree of integration of the semiconductor device, the size C of the contact hole exceeds the limit of microfabrication determined by a wavelength of a light source of an exposing device. $f(\alpha, \beta)$ is a function setting a and $\beta$ to be variables.

In order to solve such a problem, a self-alignment contact technique has been utilized at the time of the manufacture of the semiconductor device having a 0.25 $\mu$m rule.

In a DRAM (Dynamic Random Access Memory), the self-alignment contact technique is used most often in forming a bit line contact and a storage node contact which are formed between word lines in a memory cell array. In this case, it is important that a source/drain region of a memory cell transistor, and a bit line and a storage node are to be connected with a low resistance in any way without an electrical short circuit with a word line. The "bit line contact" indicates a contact plug to be connected to a bit line and the "storage node contact" indicates a contact plug to be connected to a storage node of a DRAM capacitor.

With reference to FIG. 29, description will be given to a method of manufacturing a conventional semiconductor device in which the self-alignment contact technique is used. FIG. 29 is a sectional view showing a structure of the conventional semiconductor device. The semiconductor device shown in FIG. 29 has a memory cell of a DRAM, for example, and FIG. 29 shows a part thereof.

Referring to FIG. 29, in the method of manufacturing the conventional semiconductor device, an element isolation insulating film 105 formed of a silicon oxide film is first formed in a main surface of a semiconductor substrate 101, for example. Then, a p-type well region 108 to be a p-type impurity region is formed in the main surface of the semiconductor substrate 101 divided by the element isolation insulating film 105.

Next, a plurality of gate structures 160 and a plurality of source/drain regions 113a and 113b are formed. In the gate structure 160, a gate insulating film 109, a gate electrode 150 to be a word line and a cap film 112 are provided on the p-type well region 108 in this order. The gate electrode 150 has such a structure that a polysilicon film 110, a buffer film which is not shown and a metal film 111 are provided in this order.

The gate insulating film 109 is formed by a silicon oxide film, for example, and the cap film 112 is formed by a silicon nitride film, for example. Moreover, the buffer film of the gate electrode 150 is formed of WSiN, for example, and the metal film 11 is formed of tungsten (W), for example.

The source/drain regions 113a and 113b are n-type impurity regions respectively and are formed in an upper surface of the p-type well region 108 at a predetermined distance. More specifically, the source/drain regions 113a and 113b are formed in the upper surface of the p-type well region 108 interposed between the gate structures 160 which are adjacent to each other.

Next, a sidewall insulating film 117 formed of a silicon nitride film is formed on a side surface of the gate structure 160, for example. By using a selective epitaxial growth method, then, epitaxial layers 119a and 119b are formed in self-alignment on the source/drain regions 113a and 113b, respectively.

Thereafter, a silicide layer which is not shown is formed on only upper surfaces of the epitaxial layers 119a and 119b. More specifically, a titanium (Ti) film is first formed on a whole surface by sputtering and a heat treatment is successively carried out. Consequently, silicon reacts to Ti so that siliciding is carried out. By removing an unreacted titanium film, subsequently, a silicide layer is formed on only the upper surfaces of the epitaxial layers 119a and 119b.

Next, a space between the gate structures 160 is filled and an interlayer insulating film 121 is formed over a whole surface. Then, an upper surface of the interlayer insulating film 121 is flattened. The interlayer insulating film 121 is formed by a silicon oxide film containing an impurity such as boron and phosphorus. Thereafter, a resist having a predetermined opening pattern is formed on the interlayer insulating film 121 and the interlayer insulating film 121 is selectively etched. Consequently, a contact hole 130a reaching the silicide layer provided on the epitaxial layer 119a and a contact hole 130b reaching the silicide layer provided on the epitaxial layer 119b are formed. When the interlayer insulating film 121 is to be etched, the sidewall insulating film 117 and the cap film 112 in the gate structure 160 function as etching stoppers. Therefore, the gate electrode 150 is not exposed and the contact holes 130a and 130b are formed in self-alignment.

Next, a contact plug 122a for filling in the contact hole 130a and a contact plug 122b for filling in the contact hole 130b are formed. Each of the contact plugs 122a and 122b is formed by a polysilicon film, for example. Then, an electrical connection to the contact plug 122b is carried out to provide a bit line which is not shown. Consequently, the bit line and the source/drain region 113b are electrically connected to each other through the contact plug 122b and the epitaxial layer 119b.

Moreover, an electrical connection to the contact plug 122a is carried out to provide a storage node of a DRAM capacitor which is not shown. Consequently, the storage node of the capacitor and the source/drain region 113a are electrically connected to each other through the contact plug 122a and the epitaxial layer 119a. Then, a dielectric film and an upper electrode in the capacitor are provided.

Prior art document information related to a semiconductor device using a self-alignment contact technique includes patent documents 1 (Japanese Patent Application Laid-Open No. 6-37272 (1994)) and 2 (Japanese Patent Application Laid-Open No. 2001-44382). Moreover, prior art document information related to a semiconductor device using a selective epitaxial growth method includes a non-patent document 1 (Hideaki Matsuhashi and three others, "Development of 0.15 μm Gate Length SOI COMS Transistor using Elevated Source/Drain", Oki Electric Industry Co., Ltd. Research and Development, October 2000, No. 184, Vol. 67, No. 3, pp. 61 to 64).

In the conventional semiconductor device having the above-mentioned structure, since a side surface of the gate electrode 150 is not exposed when the contact holes 130a and 130b are to be formed, the sidewall insulating film 117 requires a certain thickness. Therefore, it is hard to reduce the thickness of the sidewall insulating film 117. For this reason, when a space width between the word lines, that is, between the gate electrodes 150 is reduced, a contact area between the epitaxial layer 119a and the source/drain region 113a and that between the epitaxial layer 119b and the source/drain region 113b are decreased and an electric resistance between the contact plug 122a and the source/drain region 113a and an electric resistance between the contact plug 122b and the source/drain region 113b are increased.

Referring to the above-mentioned contents, in other words, when the thickness of the sidewall insulating film 117 is reduced to maintain values of the electric resistances between the contact plugs 122a and 122b and the source/drain regions 113a and 113b even if the space width between the gate electrodes 150 is reduced, the gate electrode 150 and the contact plugs 122a and 122b are electrically short-circuited if an error is made on an overlay accuracy or a dimensional accuracy in a photolithographic process in the formation of the contact holes 130a and 130b. Consequently, there is a problem in that a function operation failure is generated or the failure converges with difficulty in burn-in.

In particular, the above-mentioned problem greatly influences a performance of the semiconductor device according to a 0.13 μm design rule or less in which the space between the gate electrodes 150 is remarkably reduced.

In a DRAM according to the 0.13 μm design rule or less, moreover, a current driving capability is deteriorated when a channel width of a memory cell transistor is reduced. In order to cause the memory cell to carry out a stable operation, therefore, it is necessary to set an electric resistance between a contact plug and a source/drain region to be equal to or lower than that in a previous generation irrespective of microfabrication.

SUMMARY OF THE INVENTION

It is an object of the present invention to provide a technique for reducing an electric resistance between a contact plug and an impurity region to be electrically connected thereto while maintaining an insulating property between a gate electrode and the contact plug.

The present invention is directed to a method of manufacturing a semiconductor device including the steps (a) to (g). The step (a) is for forming a semiconductor substrate having a first impurity region exposed in a main surface and having, on the main surface, a gate structure including a gate electrode provided with a first insulating film on a side part thereof. The step (b) is for forming an epitaxial layer on the first impurity region so that the first insulating film lies between the epitaxial layer and the gate electrode. The step (c) is for forming a second insulating film on a side part of the gate electrode and a whole upper surface of the epitaxial layer. The step (d) is for forming an interlayer insulating film on an upper surface of a structure obtained by execution of the step (c). The step (e) is for etching the interlayer insulating film using the second insulating film as an etching stopper, thereby forming, in the interlayer insulating film, a first contact hole reaching the second insulating film provided on the epitaxial layer, the second insulating film lying between the gate electrode and the first contact hole. The step (f) is for etching the second insulating film exposed by execution of the step (e), thereby forming a second contact hole reaching the epitaxial layer in the second insulating film. The step (g) is for forming a contact plug to fill in the first and second contact holes.

Also in the case in which a thickness of the first insulating film is decreased and a contact area between the first impurity region and the epitaxial layer is increased in order to reduce an electric resistance between the contact plug to be formed at the step (g) and the first impurity region, a thickness of the second insulating film is regulated at the step (c) so that the gate electrode can be prevented from being exposed when the first contact hole is to be formed at the step (e). As a result, it is possible to reduce the electric resistance between the first impurity region and the contact plug while maintaining an insulating property between the gate electrode and the contact plug.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
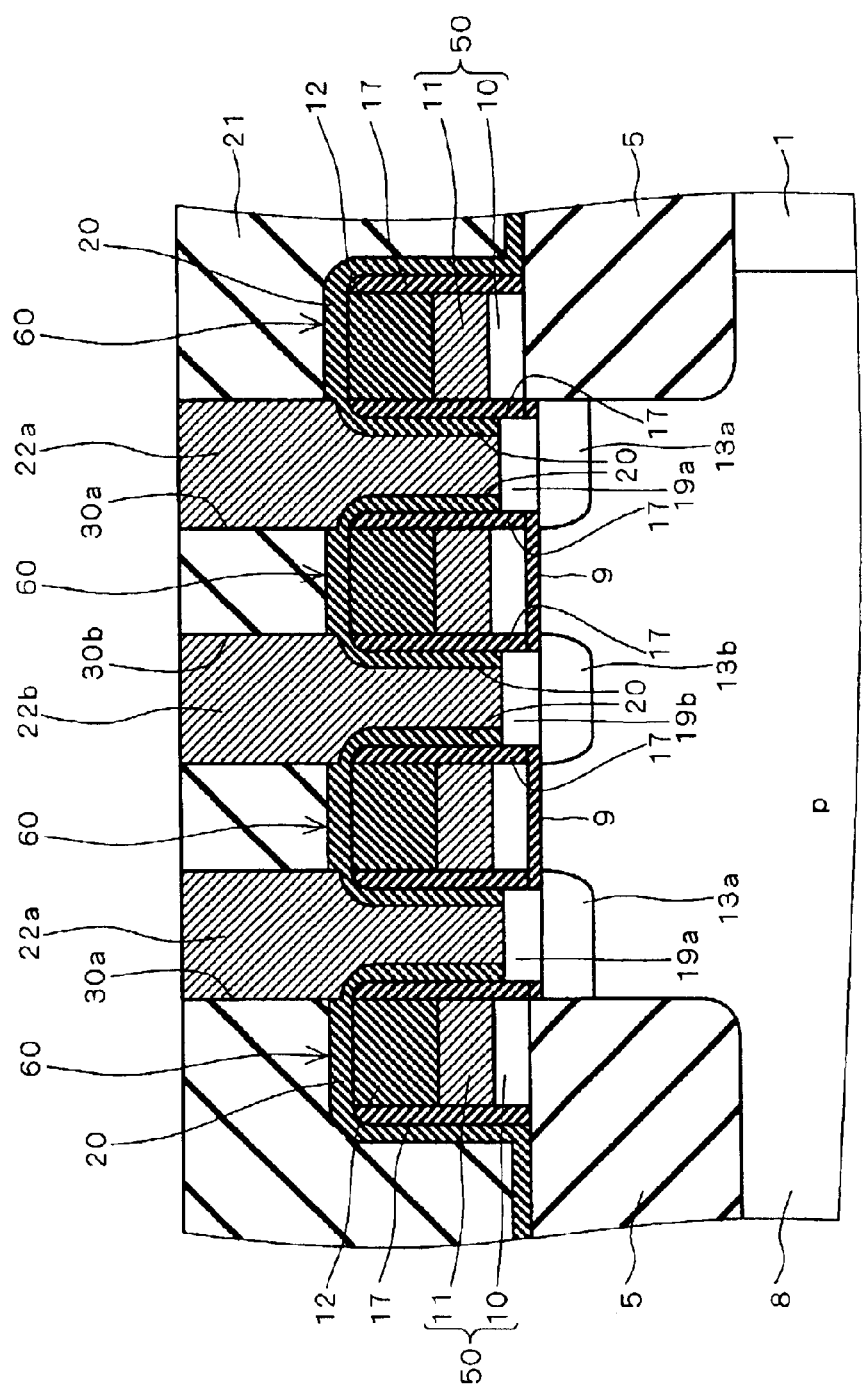
FIG. 1 is a sectional view showing a structure of a semiconductor device according to a first embodiment of the present invention.

FIG. 1 is a sectional view showing a structure of a semiconductor device according to a first embodiment of the present invention. The semiconductor device shown in FIG. 1 has a memory cell of a DRAM, for example, and FIG. 1 shows a part thereof.

As shown in FIG. 1, the semiconductor device according to the first embodiment comprises a semiconductor substrate 1, a plurality of gate structures 60, a sidewall insulating film 17 provided on a side surface of each of the gate structures 60, an etching blocking film 20, epitaxial layers 19a and 19b, an interlayer insulating film 21, contact holes 30a and 30b, and contact plugs 22a and 22b.

The semiconductor substrate 1 is formed by a silicon substrate, for example, and has an element isolation insulating film 5, a p-type well region 8 and n-type impurity regions 13a and 13b in a main surface thereof The p-type well region 8 is a p-type impurity region and is provided in the main surface of the semiconductor substrate 1 divided by the element isolation insulating film 5. The n-type impurity regions 13a and 13b are provided in an upper surface of the p-type well region 8 with a predetermined distance from each other. Each of the n-type impurity regions 13a and 13b functions as source/drain region of a memory cell transistor.

The gate structure 60 in FIG. 1 is a gate structure of the memory cell transistor and is provided on the p-type well region 8 interposed between the n-type impurity region 13a and the n-type impurity region 13b. Moreover the gate structure 60 has such a structure that a gate insulating film 9, a gate electrode 50 which functions as a word line and a cap film 12 are provided on the p-type well region 8 in this order. The gate electrode 50 has such a structure that a polysilicon film 10 having an n-type impurity introduced therein, a buffer film which is not shown, and a metal film 11 are provided in this order. A silicon oxide film which is not shown is provided on a side surface of the polysilicon film 10 in the gate electrode 50.

The gate insulating film 9 is formed by a silicon oxide film, for example, and the cap film 12 is formed by a silicon nitride film, for example. Moreover, the buffer film of the gate electrode 50 is formed of WSiN, for example, and the metal film 11 is formed of tungsten (W), for example.

The sidewall insulating film 17 is formed by a silicon nitride film, for example, and is provided on side surfaces of the gate electrode 50 and the cap film 12 in each gate structure 60. Moreover, the sidewall insulating film 17 is also provided above the n-type impurity regions 13a and 13b through the gate insulating film 9.

The epitaxial layer 19a is provided on an upper surface of the n-type impurity region 13a and is partially provided on the sidewall insulating films 17 which are positioned above the n-type impurity region 13a and are opposed to each other. For this reason, the sidewall insulating film 17 positioned above the n-type impurity region 13a is provided between the epitaxial layer 19a and the gate electrode 50.

The epitaxial layer 19b is provided on an upper surface of the n-type impurity region 13b and is partially provided on the sidewall insulating films 17 which are positioned above the n-type impurity region 13b and are opposed to each other. For this reason, the sidewall insulating film 17 positioned above the n-type impurity region 13b is provided between the epitaxial layer 19b and the gate electrode 50. Each of the epitaxial layers 19a and 19b is formed by a selective epitaxial growth method.

The etching blocking film 20 is formed by a silicon nitride film, for example, and is provided on the sidewall insulating film 17 and the cap film 12, and is partially provided on the epitaxial layers 19a and 19b.

The interlayer insulating film 21 is formed by a silicon oxide film containing an impurity such as phosphorus or boron, and fills in a space between the gate structures 60 and covers the semiconductor substrate 1, the epitaxial layers 19a and 19b, the gate structures 60, the sidewall insulating films 17 and the etching blocking film 20.

Each of contact holes 30a and 30b is provided in the interlayer insulating film 21 and the etching blocking film 20. The contact hole 30a reaches the epitaxial layer 19a and the etching blocking film 20 and the sidewall insulating film 17 lie between the epitaxial layer 19a and the gate electrode 50. Moreover, the contact hole 30b reaches the epitaxial layer 19b and the etching blocking film 20 and the sidewall insulating film 17 lie between the epitaxial layer 19b and the gate electrode 50.

Each of contact plugs 22a and 22b is formed by a polysilicon film doped with an n-type impurity, for example. The contact plugs 22a and 22b fill in the contact holes 30a and 30b, respectively.

The semiconductor device according to the first embodiment is provided with a bit line connected electrically to the contact plug 22b, which is not shown in FIG. 1. The bit line and the n-type impurity region 13b are electrically connected to each other through the contact plug 22b and the epitaxial layer 19b.

Moreover, the semiconductor device according to the first embodiment is provided with a capacitor of a memory cell, which is not shown in FIG. 1. A storage node of the capacitor is electrically connected to the contact plug 22a, and the storage node and the n-type impurity region 13a are electrically connected to each other through the contact plug 22a and the epitaxial layer 19a.

Next, a method of manufacturing the semiconductor device shown in FIG. 1 will be described. FIGS. 2 to 18 are sectional views showing the method of manufacturing the semiconductor device illustrated in FIG. 1 in order of a step. In the semiconductor device illustrated in FIG. 1, a portion in which the memory cell of the DRAM is formed in the structure shown in FIG. 18 is enlarged.

Figure 2:
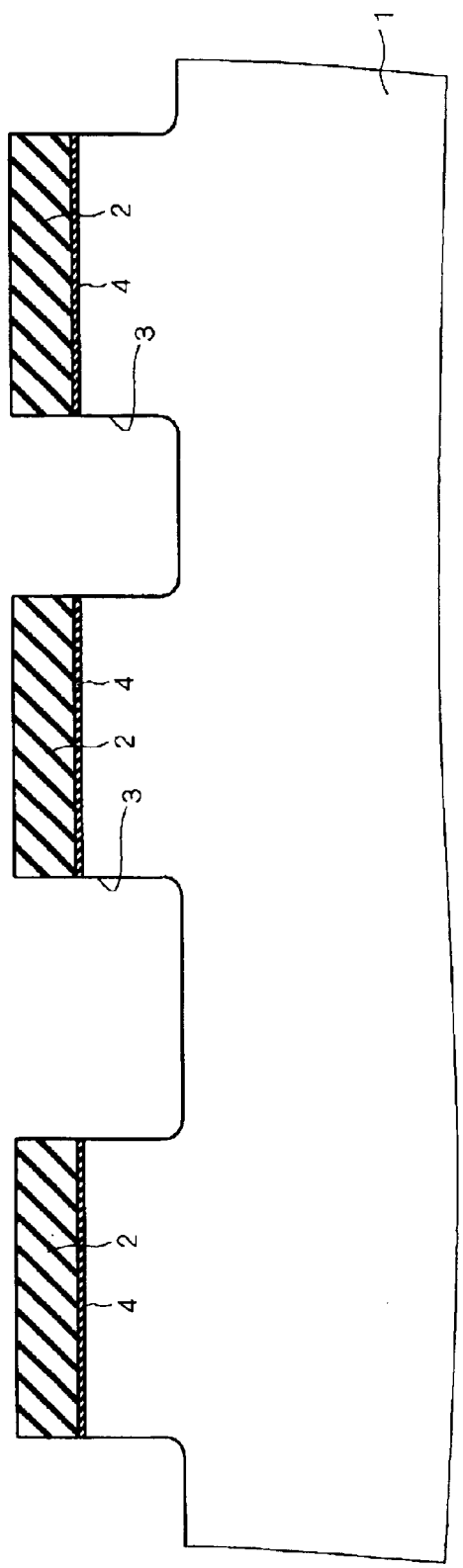
FIGS. 2 to 18 are sectional views showing a method of manufacturing the semiconductor device according to the first embodiment of the present invention in order of a step.

As shown in FIG. 2, first of all, a buffer insulating film 4 having a thickness of 15 nm is formed on a semiconductor substrate 1. The buffer insulating film 4 can be formed by wet oxidizing a surface of the semiconductor substrate 1, for example.

Next, a silicon nitride film 2 having a thickness of 100 nm is formed on the buffer insulating film 4 by a CVD (Chemical Vapor Deposition) method, for example. A photoresist which is not shown is formed on the silicon nitride film 2 and a predetermined opening pattern is formed in the photoresist by a photolithographic process, Using the photoresist having the predetermined opening pattern as a mask, a laminated film formed of the silicon nitride film 2 and the buffer insulating film 4 is subjected to anisotropic etching by a dry etching method, and the silicon nitride film 2 and the buffer insulating film 4 are partially removed. Then, the photoresist is removed.

Using the laminated film formed of the silicon nitride film 2 and the buffer insulating film 4 as masks, next, the semiconductor substrate 1 is subjected to anisotropic etching by 250 nm in a direction along the thickness thereof by the dry etching method. Consequently, shallow trenches 3 are formed on the semiconductor substrate 1. Then, a surface of the shallow trench 3 is thermally oxidized to remove a damage generated when the shallow trench 3 is formed.

Figure 3:
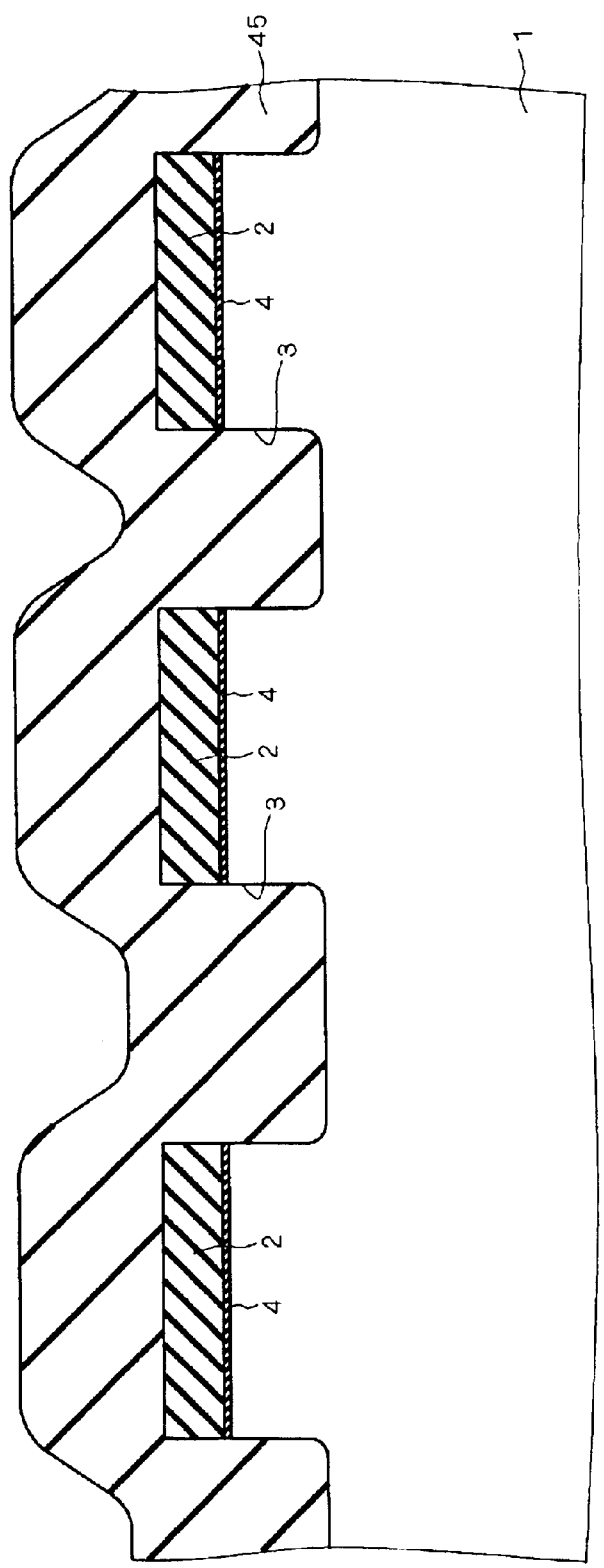

As shown in FIG. 3, then, a silicon oxide film 45 is formed on the semiconductor substrate 1 and the silicon nitride film 2 and fills in the shallow trench 3 at the same time. It is preferable that a step of filling the shallow trench 3 with the silicon oxide film 45 should be carried out by a method having an excellent step coverage. For such a method, a CVD method using an HDP (high density plasma) is preferable.

Figure 4:
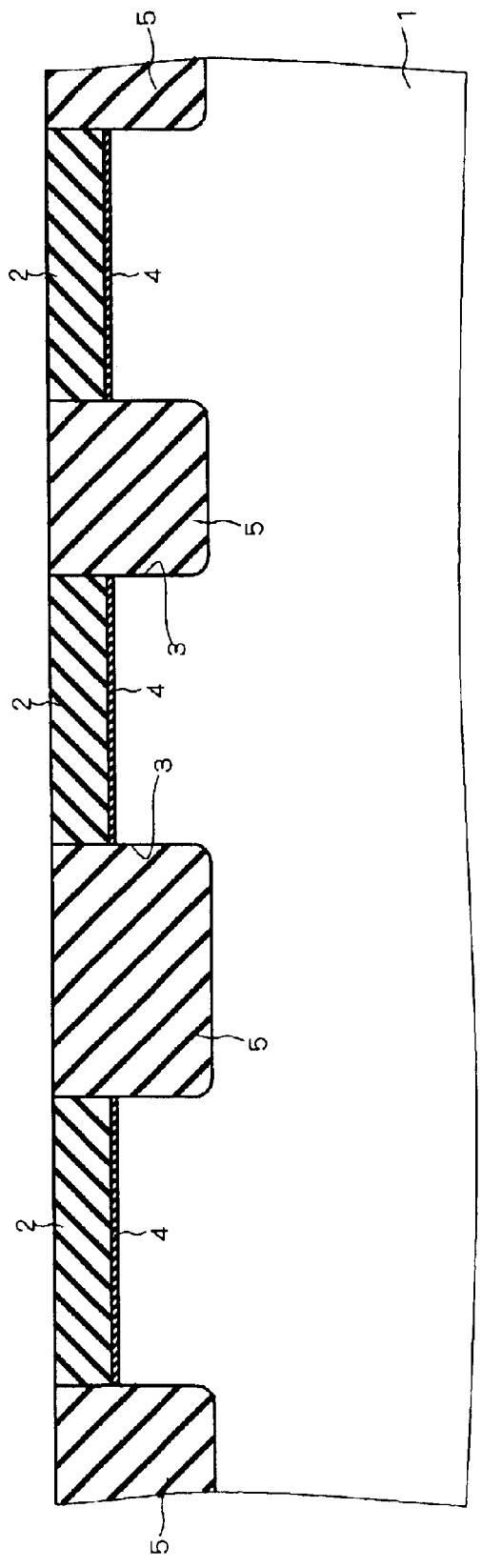

As shown in FIG. 4, thereafter, the silicon oxide film 45 is polished from an upper surface thereof by using a CMP method. At this time, the silicon nitride film 2 functions as a stopper for the polishing. Consequently, an element isolation insulating film 5 which is formed by a silicon oxide film and fills in the shallow trench 3 is finished and an upper surface of a structure which is being processed is flattened. After the polishing, a heat treatment is carried out in an argon (Ar) atmosphere, for example, and the element isolation insulating film 5 is thus annealed.

Figure 5:
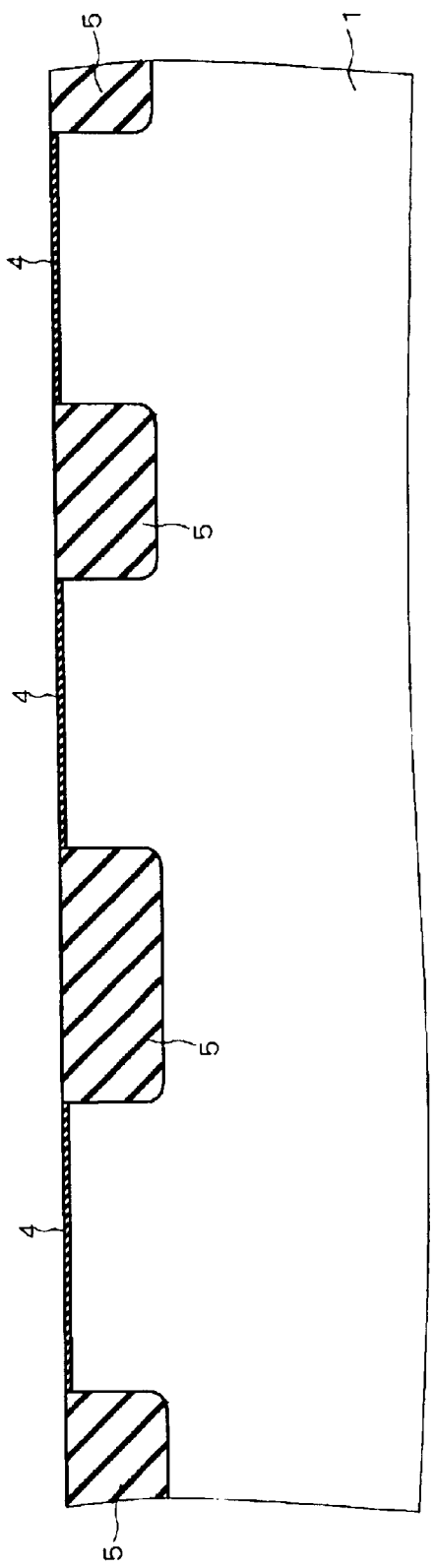
Figure 6:
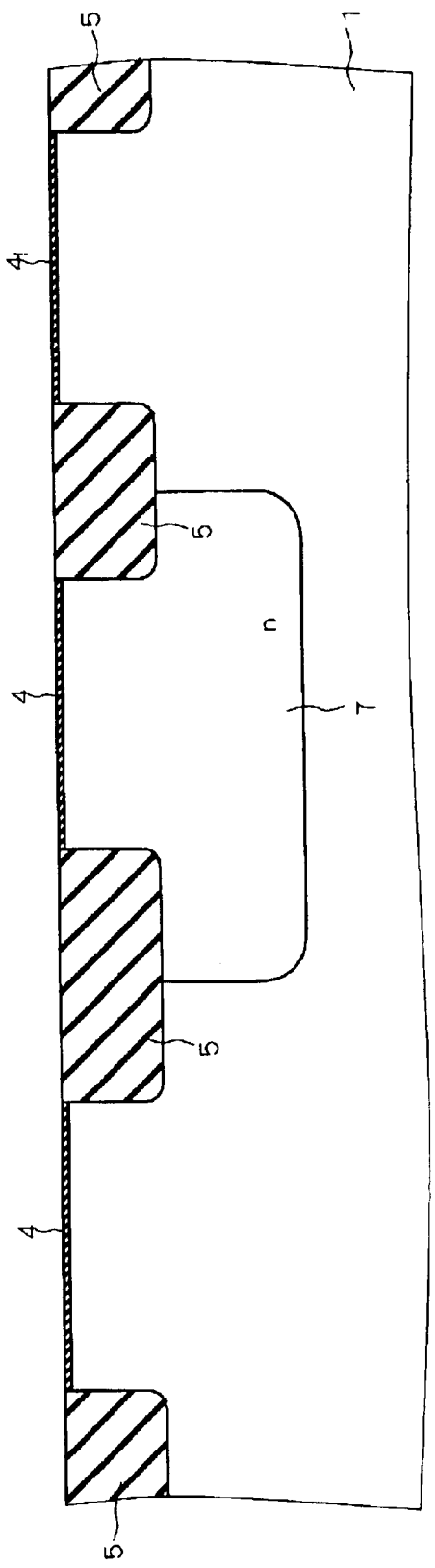

As shown in FIG. 5, next, the element isolation insulating film 5 is partially removed such that an upper surface of the element isolation insulating film 5 and that of the buffer insulating film 4 are positioned on almost the level with each other. Subsequently, the silicon nitride film 2 is removed to expose the buffer insulating film 4. Then, a photoresist (not shown) having a predetermined opening pattern is formed above the semiconductor substrate 1, more specifically, on the buffer insulating film 4 and the element isolation insulating film 5. Thereafter, ion implantation is carried out using the photoresist as a mask so that an n-type impurity is introduced into a main surface of the semiconductor substrate 1. As shown in FIG. 6, consequently, an n-type well region 7 to be an n-type impurity region is formed in the main surface of the semiconductor substrate 1 divided by the element isolation insulating film 5. A plurality of p-type MOS transistors of a logic circuit are formed in the n-type well region 7, for example. Moreover, the ion implanting step is properly carried out if necessary and a threshold voltage of the transistor is regulated as designed.

Figure 7:
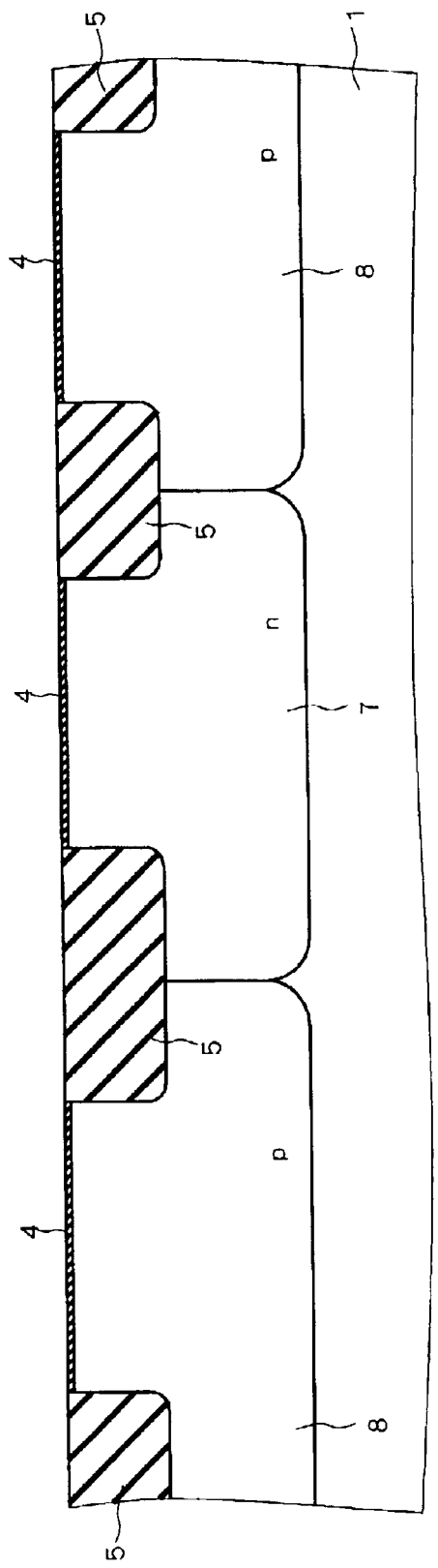

Subsequently, the photoresist used for forming the n-type well region 7 is removed and a photoresist (not shown) having a predetermined opening pattern is formed above the semiconductor substrate 1, more specifically, on the buffer insulating film 4 and the element isolation insulating film 5. Then, ion implantation is carried out using the photoresist as a mask so that a p-type impurity is introduced into the main surface of the semiconductor substrate 1. As shown in FIG. 7, consequently, a p-type well region 8 to be a p-type impurity region is formed in the main surface of the semiconductor substrate 1 divided by the element isolation insulating film 5. While two p-type well regions 8 are shown in FIG. 7, n-type MOS transistors functioning as a memory cell transistor of a DRAM are formed in one of the p-type well regions 8 and n-type MOS transistors of a logic circuit are formed in the other well region 8, for example. Moreover, the ion implanting step is properly carried out if necessary so that the threshold voltage of the transistor is regulated as designed. The p-type well region 8 in which the memory cell transistor of the DRAM is to be formed will be referred to as "a well region 8 for a memory cell" and the p-type well region 8 which an n-type MOS transistor of a logic circuit is to be formed will be referred to as "a well region 8 for a logic".

Figure 8:
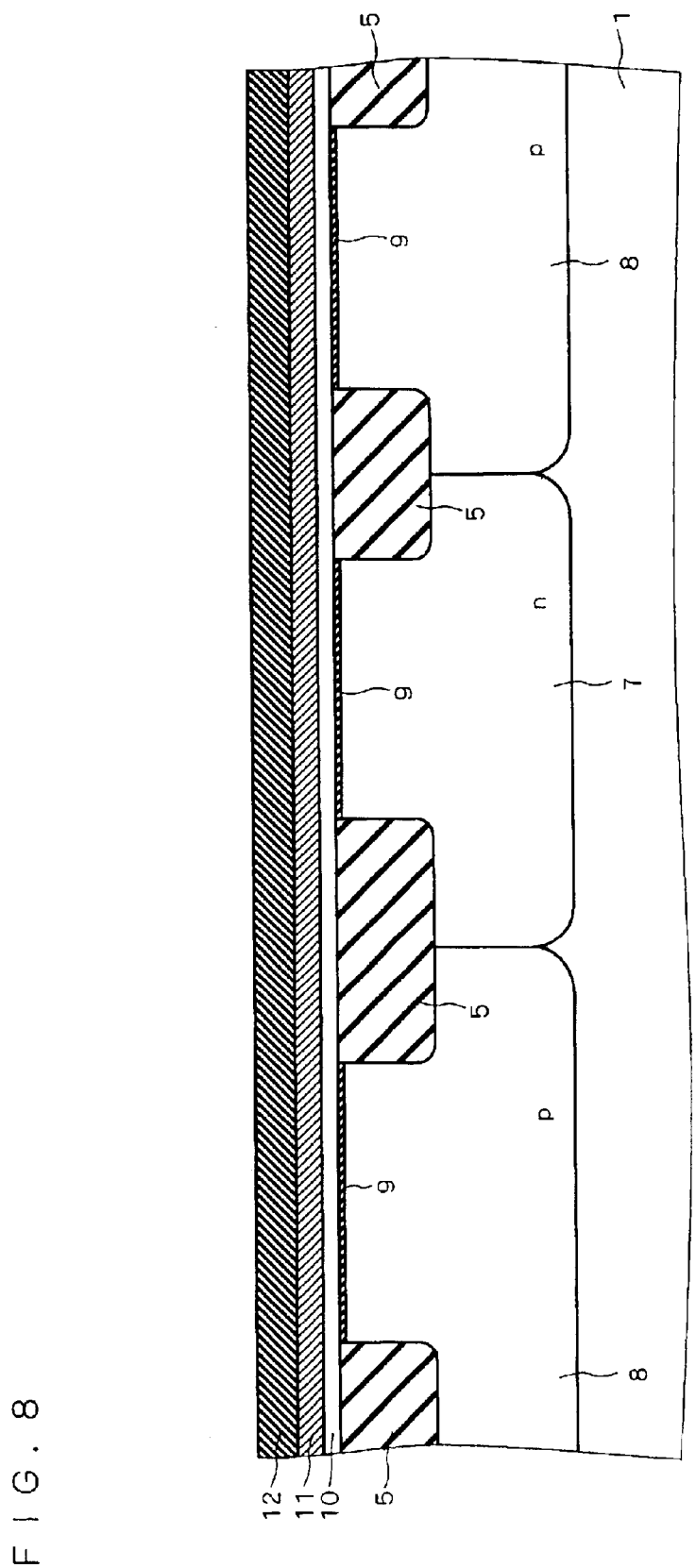

As shown in FIG. 8, next, the buffer insulating film 4 provided on the semiconductor substrate 1 is removed and a surface of the semiconductor substrate 1 exposed again is thermally oxidized. Consequently, a gate insulating film 9 is formed on the semiconductor substrate 1. Then, a polysilicon film 10 having a thickness of 50 nm and an n-type impurity introduced therein is formed on the element isolation insulating film 5 and the gate insulating film 9 by a CVD method, for example.

Subsequently, a buffer layer (not shown) having a thickness of 5 nm is formed on the polysilicon film 10 by sputtering, for example. Thereafter, a metal film 11 having a thickness of 50 nm is formed on the buffer layer by the sputtering, for example. In the case in which the metal film 11 is directly formed on the polysilicon film 10, the polysilicon film 10 reacts to the metal film 11 and a tungsten silicide film having a comparatively high resistance is formed therebetween. In the present embodiment, a buffer layer is provided between the polysilicon film 10 and the metal film 11 in order to prevent the formation of the tungsten silicide film.

Figure 9:
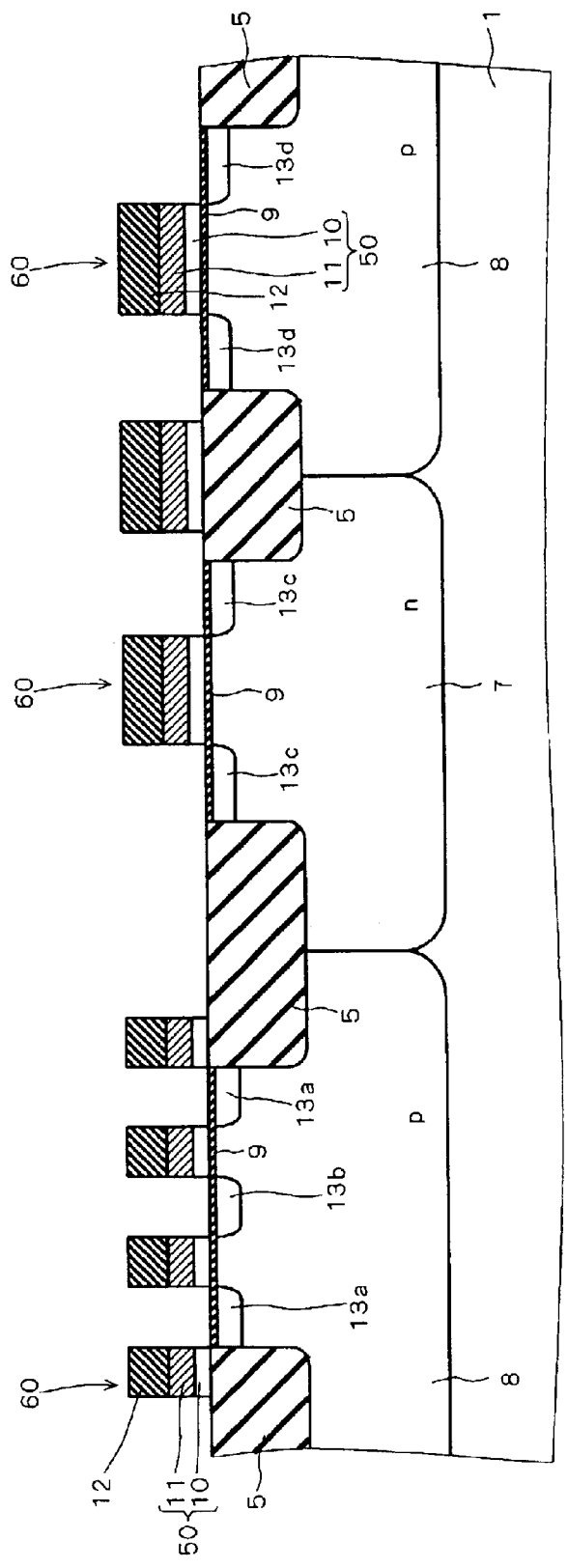

Next, a cap film 12 having a thickness of 180 nm is formed on the metal film 11 by the CVD method, for example. Then, a photoresist (not shown) having a predetermined opening pattern is formed on the cap film 12, and the cap film 12, the metal film 11, the buffer layer and the polysilicon film 10 are subjected to etching and patterning using the photoresist as a mask. As shown in FIG. 9, consequently, a plurality of gate structures 60 comprising a gate electrode 50 having a polymetal structure including the polysilicon film 10, the buffer layer and the metal film 11, the cap film 12 provided on the gate electrode 50, and the gate insulating film 9 are formed on the well region 8 for a memory cell. In other words, a plurality of gate structures 60 of the memory cell transistor are formed on the well region 8 for a memory cell. At the same time, the gate structures 60 are formed on the well region 8 for a logic and the n-type well region 7. In the present embodiment, in the gate structures 60 of the memory cell transistor which are adjacent to each other, a distance between a side surface of the gate electrode 50 in one of the gate structures 60 and that of the gate electrode 50 in the other gate structure 60 which is opposed to the side surface of the gate electrode 50 in one of the gate structures 60 (which will be hereinafter referred to as "a distance between the gate electrodes 50") is set to be 150 nm, for example.

Subsequently, the metal film 11 and the buffer layer are not oxidized but a silicon oxide film (not shown) is selectively formed on a side surface of the polysilicon film 10. The silicon oxide film can be formed by selectively oxidizing the polysilicon film 10 while reducing tungsten in an $H_2/H_2O$ atmosphere. Moreover, the silicon oxide film is formed on the polysilicon film 10 so that a damage induced in the etching of the polysilicon film 10 can be removed, and furthermore, an electric field convergence in an MOS transistor can be relieved.

Using the gate electrodes 50 and the element isolation insulating film 5 as masks, then, ion implantation is carried out over the semiconductor substrate 1 to introduce an n-type impurity into the main surface of the semiconductor substrate 1 without forming a photoresist. As shown in FIG. 9, consequently, shallow n-type impurity regions 13a and 13b having comparatively low concentrations are formed at a predetermined distance therebetween in an upper surface of the well region 8 for a memory cell. At the same time, a plurality of shallow n-type impurity regions 13d having comparatively low concentrations are formed at a predetermined distance therebetween in an upper surface of the well region 8 for a logic, and a plurality of shallow n-type impurity regions 13c having comparatively low concentrations are formed at a predetermined distance therebetween in an upper surface of the n-type well region 7. These n-type impurity regions 13a to 13d are obtained by implanting a phosphorus (P) ion in an acceleration energy of 10 keV and a dose of $2\times10^{13}$ cm$^{-2}$, for example.

Figure 10:
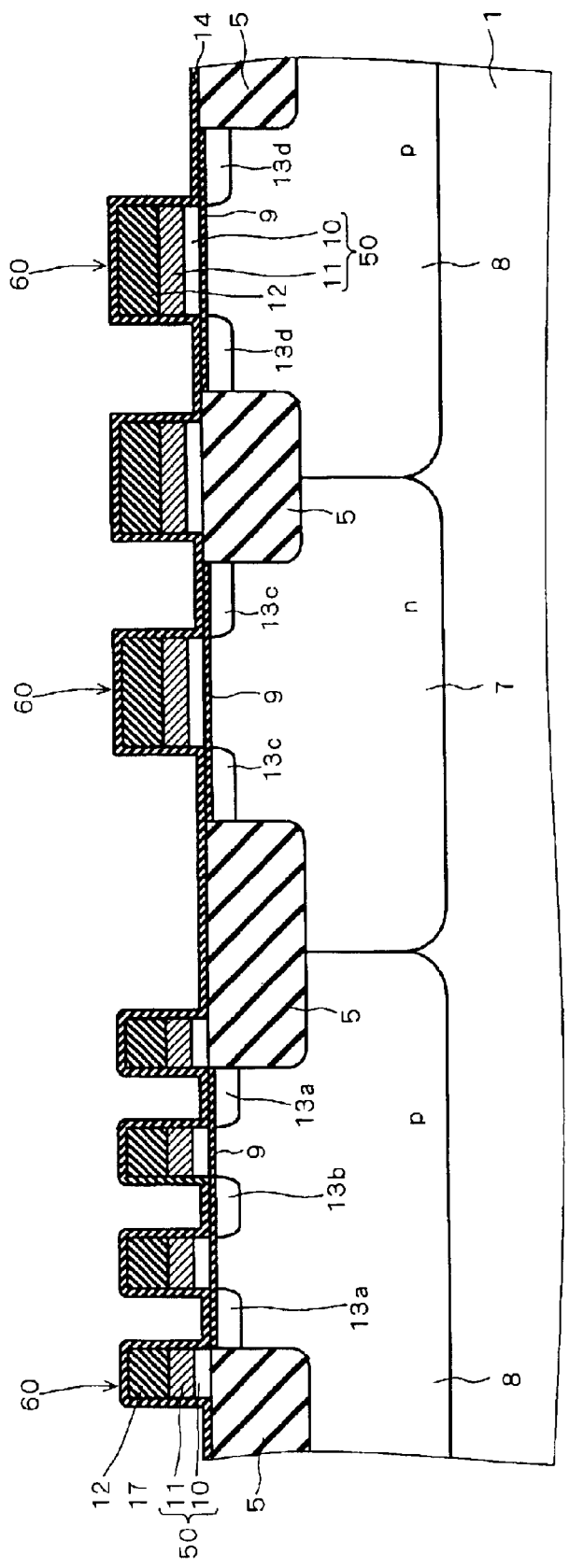
Figure 11:
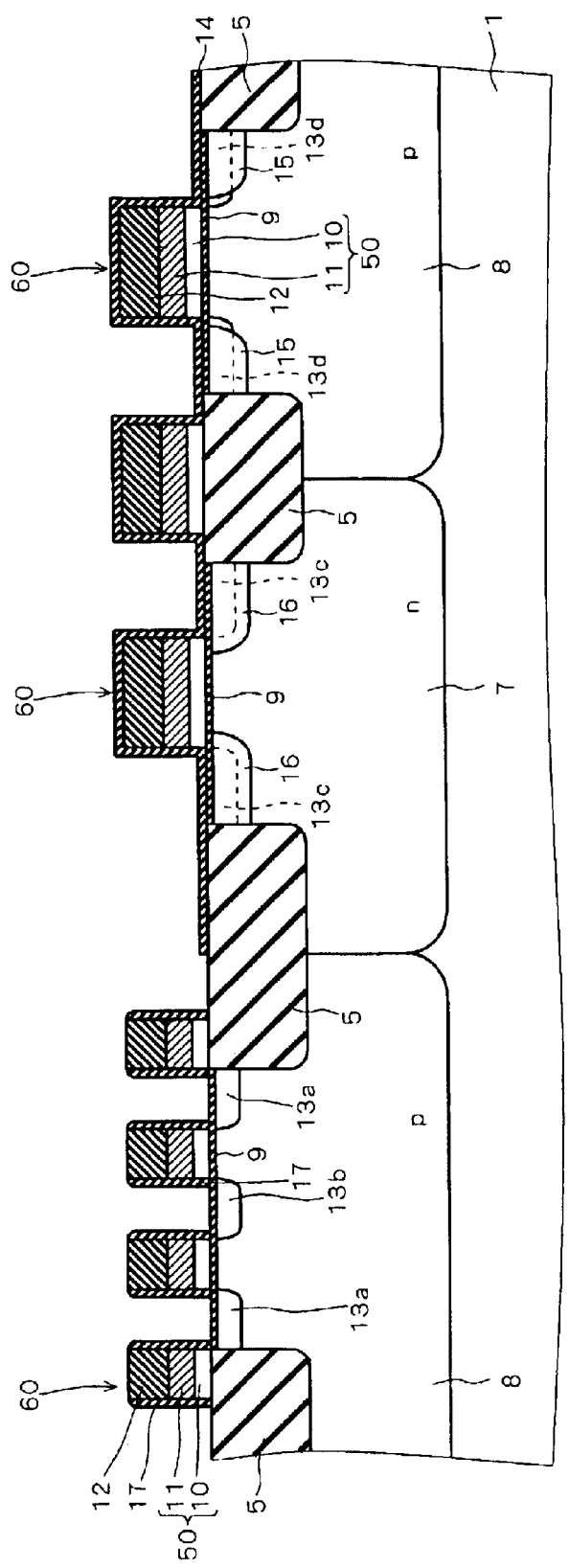

As shown in FIG. 10, next, a silicon nitride film 14 having a thickness of 15 nm is formed over a whole surface by a CVD method, for example. Then, a photoresist (not shown) having a predetermined opening pattern is formed on the silicon nitride film 14 and ion implantation is carried out using the photoresist as a mask so that an n-type impurity is introduced in the main surface of the semiconductor substrate 1. As shown in FIG. 11, consequently, deep n-type impurity regions 15 having a comparatively high concentration are formed in the upper surface of the well region 8 for a logic. The n-type impurity region 15 is obtained by implanting an arsenic (As) ion having an acceleration energy of 55 keV and a dose of $4\times10^{15}$ cm$^{-2}$, for example. In this case, the ion is implanted in the semiconductor substrate 1 through the silicon nitride film 14.

Subsequently, the photoresist used in the formation of the n-type impurity region 15 is removed and a new photoresist (not shown) having a predetermined opening pattern is formed on the silicon nitride film 14, and ion implantation is carried out using the photoresist as a mask so that a p-type impurity is introduced in the main surface of the semiconductor substrate 1. As shown in FIG. 11, consequently, deep p-type impurity regions 16 having a comparatively high concentration are formed in the upper surface of the n-type well region 7. The p-type impurity region 16 is obtained by implanting a boron ($BF_2$) ion having an acceleration energy of 40 keV and a dose of $4\times10^{15}$ cm$^{-2}$, for example. In this case, the ion is also implanted in the semiconductor substrate 1 through the silicon nitride film 14.

Then, a heat treatment is carried out at 900° C. for 10 seconds in a nitrogen atmosphere using a lamp annealing method, for example, so that the impurities in the n-type and p-type impurity regions 15 and 16 are electrically activated. Consequently, source/drain regions, each consisting of the n-type impurity regions 13d and 15, are completely formed in the upper surface of the well region 8 for a logic. Moreover, the n-type impurity region 13c is compensated by the p-type impurity region 16 so that p-type source/drain regions are completely formed in the upper surface of the n-type well region 7.

Thereafter, a photoresist (not shown) having a predetermined opening pattern is formed on the silicon nitride film 14 by a photolithographic technique and the silicon nitride film 14 is subjected to anisotropic etching using the photoresist as a mask. Consequently, a sidewall insulating film 17 formed of a silicon nitride film is formed on a side part of the gate structure 60 on the well region 8 for a memory cell, more specifically, side surfaces of the cap film 12 and the gate electrode 50 in the gate structure 60. In the case in which the sidewall insulating films 17 are to be formed, the gate insulating film 9 may also be removed by the anisotropic etching, and it is preferable that only the silicon nitride film 14 should be removed using an anisotropic etching method having a high selection ratio for the gate insulating film 9 as shown in FIG. 11 such that a damage of the etching does not remain in the semiconductor substrate 1.

Figure 12:
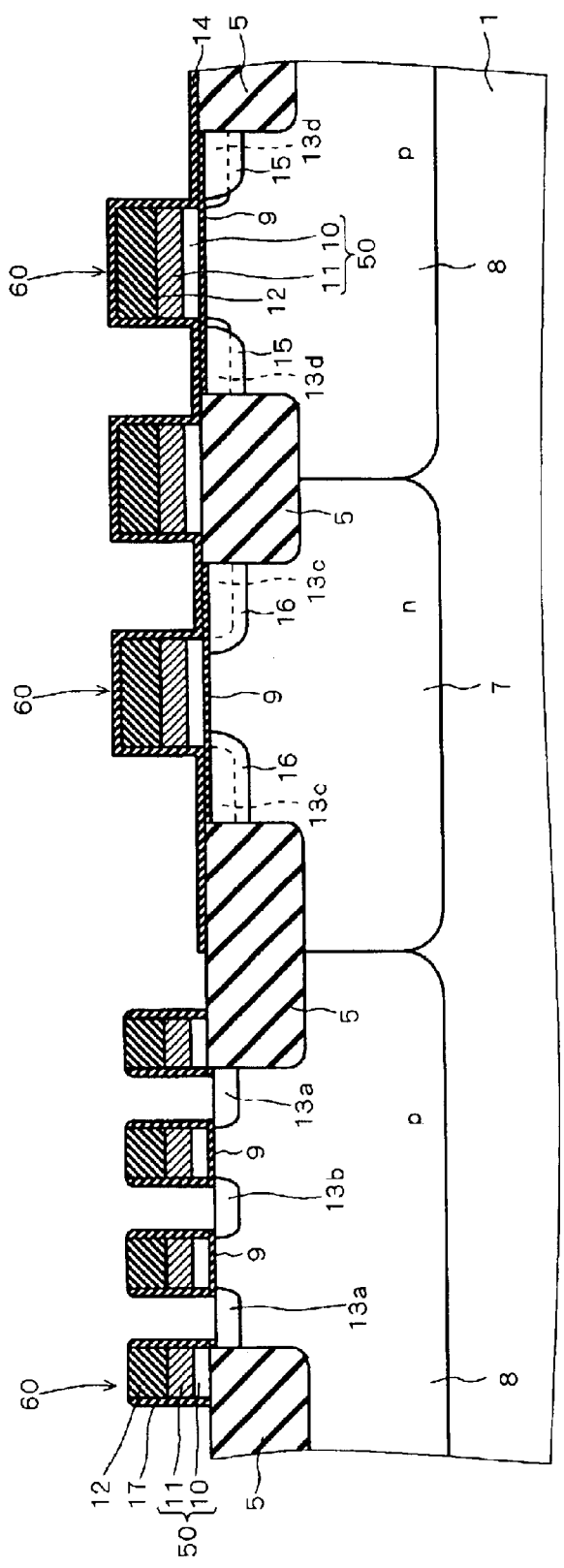
Figure 13:
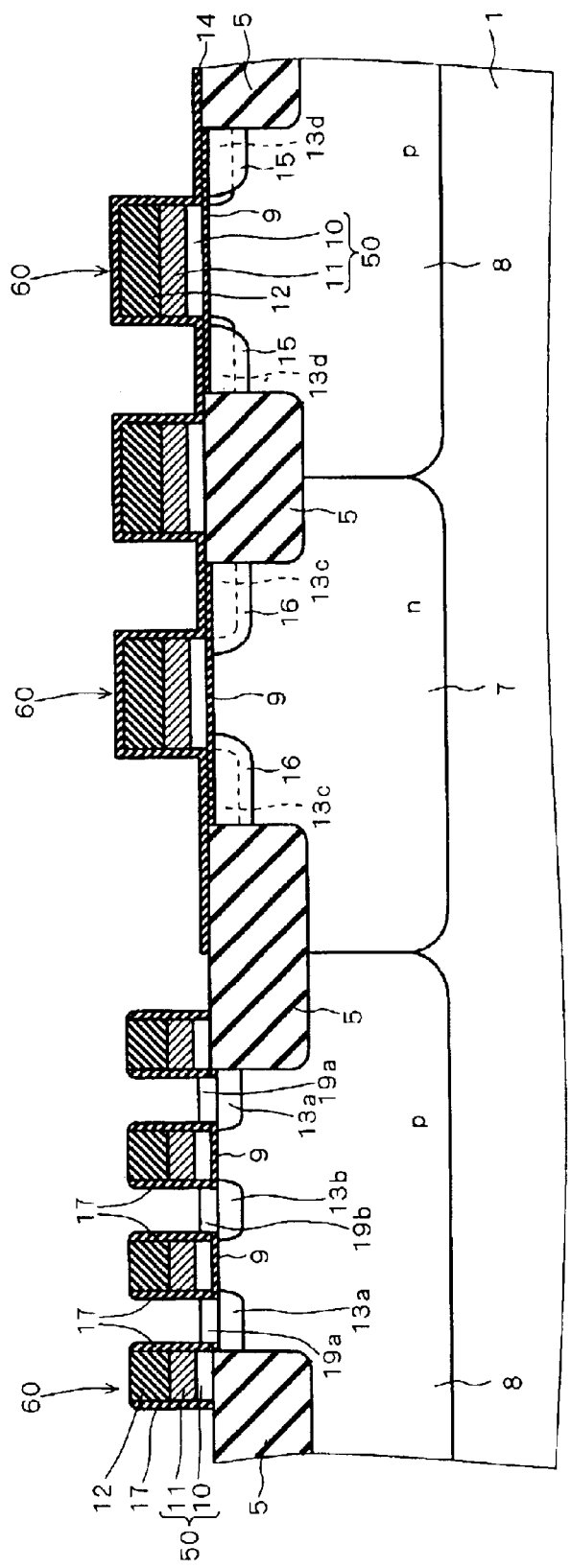

As shown in FIG. 12, next, the gate insulating film 9 formed on the n-type impurity regions 13a and 13b is removed by diluted fluoric acid (DHF) to partially expose the semiconductor substrate 1, for example. As shown in FIG. 13, then, epitaxial layers 19a and 19b are formed on the n-type impurity regions 13a and 13b by a selective epitaxial growth method, respectively. In the present embodiment, the epitaxial layers 19a and 19b are formed in self-alignment since an epitaxial growth at this time isotropically progresses. Consequently, the epitaxial layers 19a and 19b are formed on the n-type impurity regions 13a and 13b respectively so that the sidewall insulating films 17 lie between the epitaxial layers 19a and 19b and the gate electrodes 50. Each of the epitaxial layers 19a and 19b is formed in a thickness of 40 nm using an LPCVD) (low pressure CVD) method, for example.

Such an epitaxial growth step is carried out at a temperature of 680 to 850° C. and a pressure of 40 to 6666 Pa using dichlorosilane (DCS) having a flow rate of $1\times10^{-4}$ to $8\times10^{-4}$ m$^3$/min and hydrogen chloride (HCl) having a flow rate of 40 to 400 L/min. As a pretreatment for the epitaxial growth, a hydrogen ($H_2$) gas having a flow rate of 1 to 10 L/min is used. Moreover, a dimension of the epitaxial layer 19a is controlled such that the adjacent epitaxial layers 19a are electrically insulated from each other in a direction in which a word line is extended, that is, the gate electrode 50 is extended. Similarly, a dimension of the epitaxial layer 19b is controlled such that the adjacent epitaxial layers 19b are electrically insulated from each other in the direction in which the gate electrode 50 is extended. FIG. 13 is a sectional view in a vertical direction with respect to the direction in which the gate electrode 50 is extended.

Figure 14:
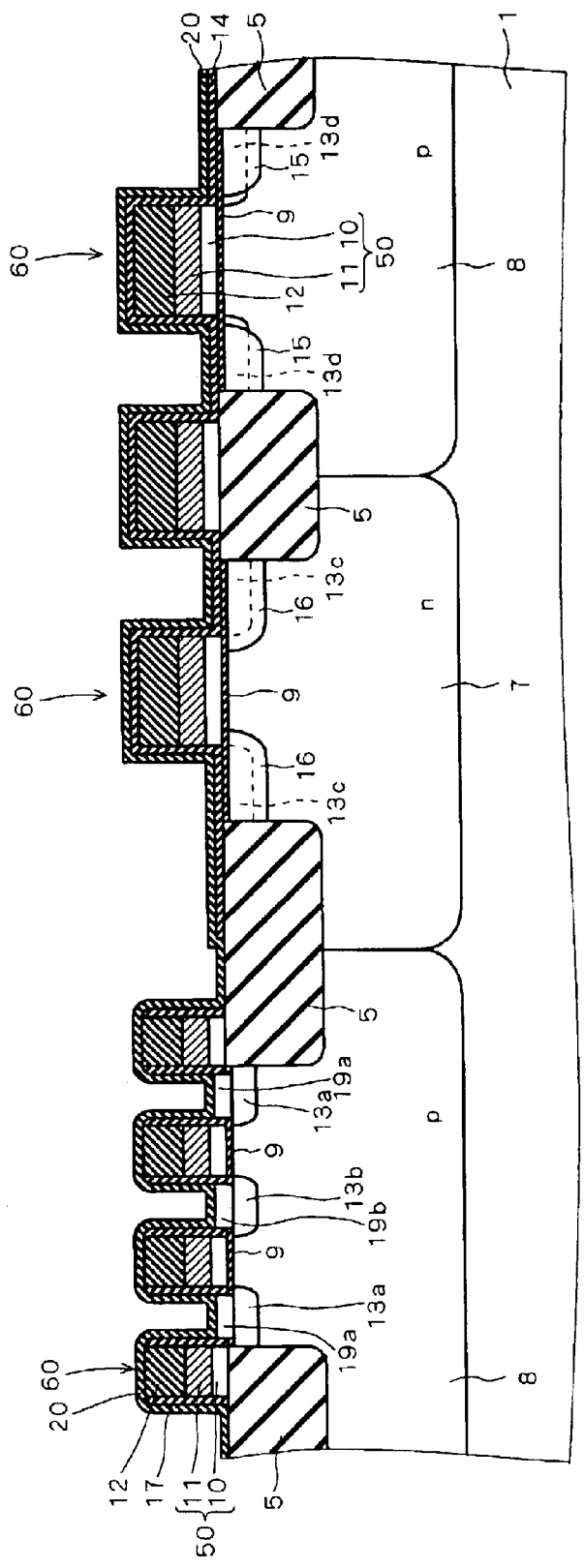
Figure 15:
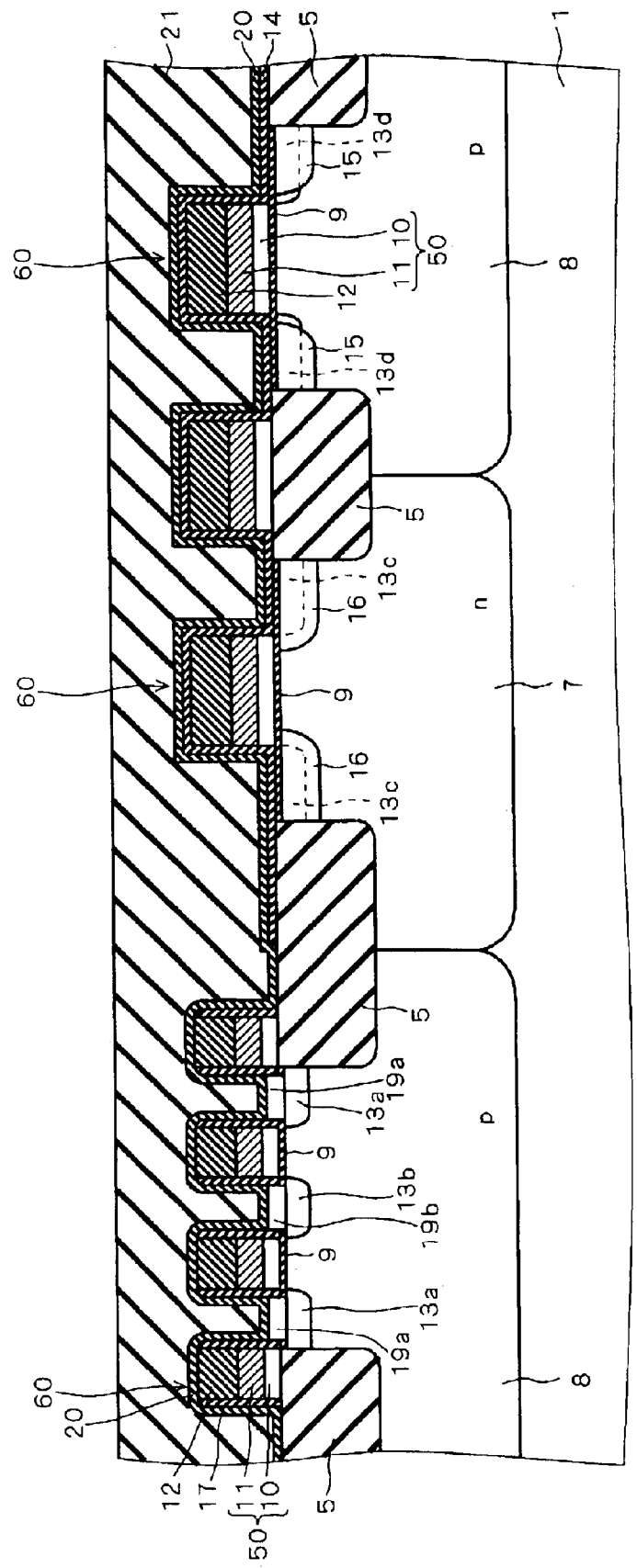

As shown in FIG. 14, next, an etching blocking film 20 formed of a silicon nitride film having a thickness of 20 nm is formed over a whole surface by a CVD method, for example. Consequently, the etching blocking film 20 is formed on a side part of the gate electrode 50 and whole upper surfaces of the epitaxial layers 19a and 19b.

Subsequently, a silicon oxide film doped with an impurity such as phosphorus or boron and having a thickness of 800 nm is deposited on the etching blocking film 20 by the CVD method, for example. The silicon oxide film is a TEOS oxide film and is formed using $B_2H_6$, $PH_3$ and TEOS as material gases. Then, a heat treatment is carried out at 950° C. for 10 seconds in an oxygen atmosphere using a lamp annealing method, for example, so that the silicon oxide film is subjected to reflow. Consequently, an interlayer insulating film 21 formed of the silicon oxide film and filling in a space between the gate structures 60 is formed on the etching blocking film 20. In order to enhance a burying performance for the space between the gate structures 60, the interlayer insulating film 21 is doped with boron.

Next, the interlayer insulating film 21 is polished by 200 nm from an upper surface thereof by using a CMP method, for example. Consequently, a structure which is being processed is flattened. The upper surface of the interlayer insulating film 21 is flattened in order to increase a process tolerance in the photolithographic process to be executed in the formation of the contact holes 30a and 30b.

Figure 16:
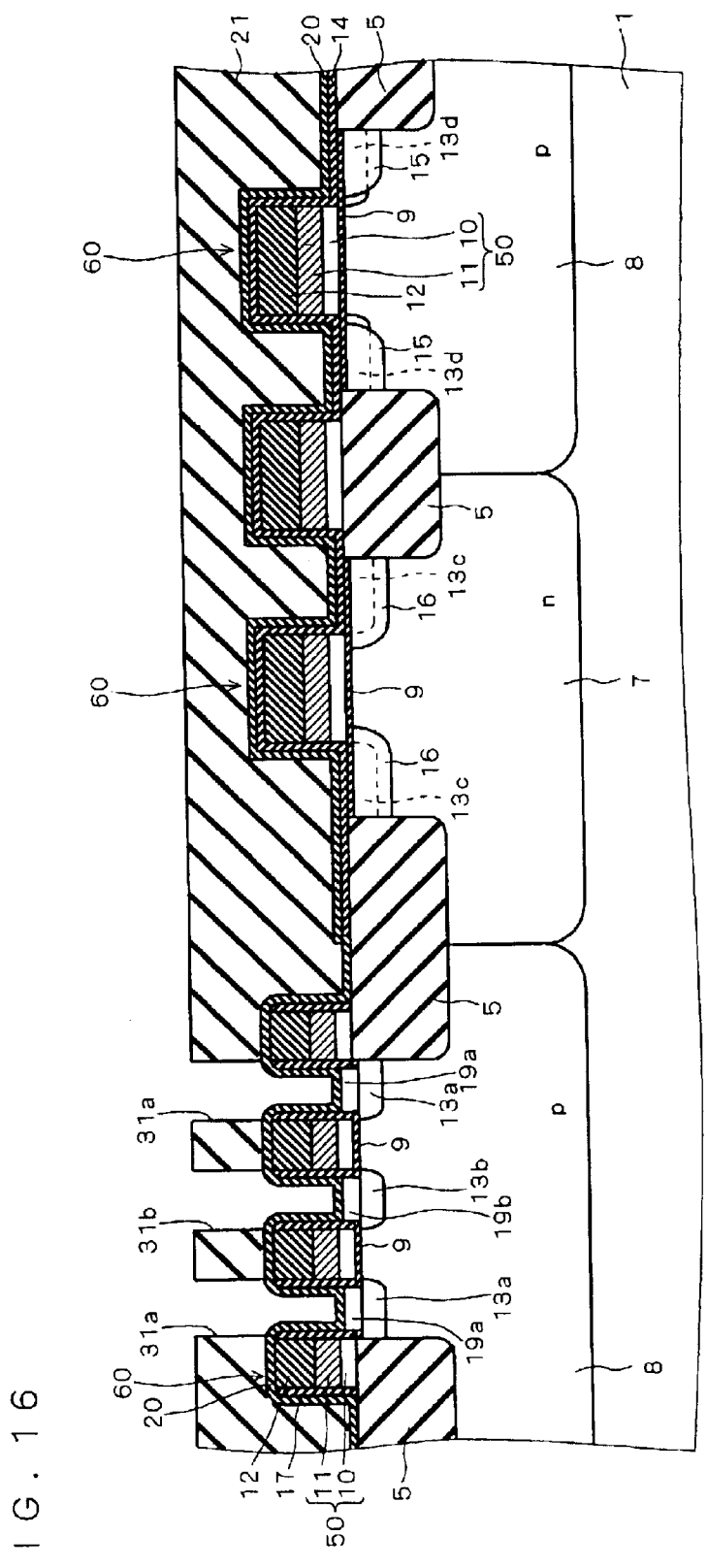

Using the photolithographic technique, then, a photoresist (not shown) having a predetermined opening pattern is formed on the interlayer insulating film 21 and the interlayer insulating film 21 is subjected to anisotropic etching using the photoresist as a mask. At this time, the etching blocking film 20 functions as an etching stopper. As shown in FIG. 16, consequently, contact holes 31a reaching the etching blocking film 20 provided on the epitaxial layer 19a are formed in the interlayer insulating film 21 in self-alignment and the etching blocking film 20 and the sidewall insulating film 17 lie between the gate electrode 50 and the contact hole 31a. At the same time, contact holes 31b reaching the etching blocking film 20 provided on the epitaxial layer 19b are formed in the interlayer insulating film 21 in self-alignment and the etching blocking film 20 and the sidewall insulating film 17 lie between the gate electrode 50 and the contact hole 31b. In order to increase a selection ratio with the etching blocking film 20 to be used as an etching stopper, the interlayer insulating film 21 is doped with phosphorus.

Figure 17:
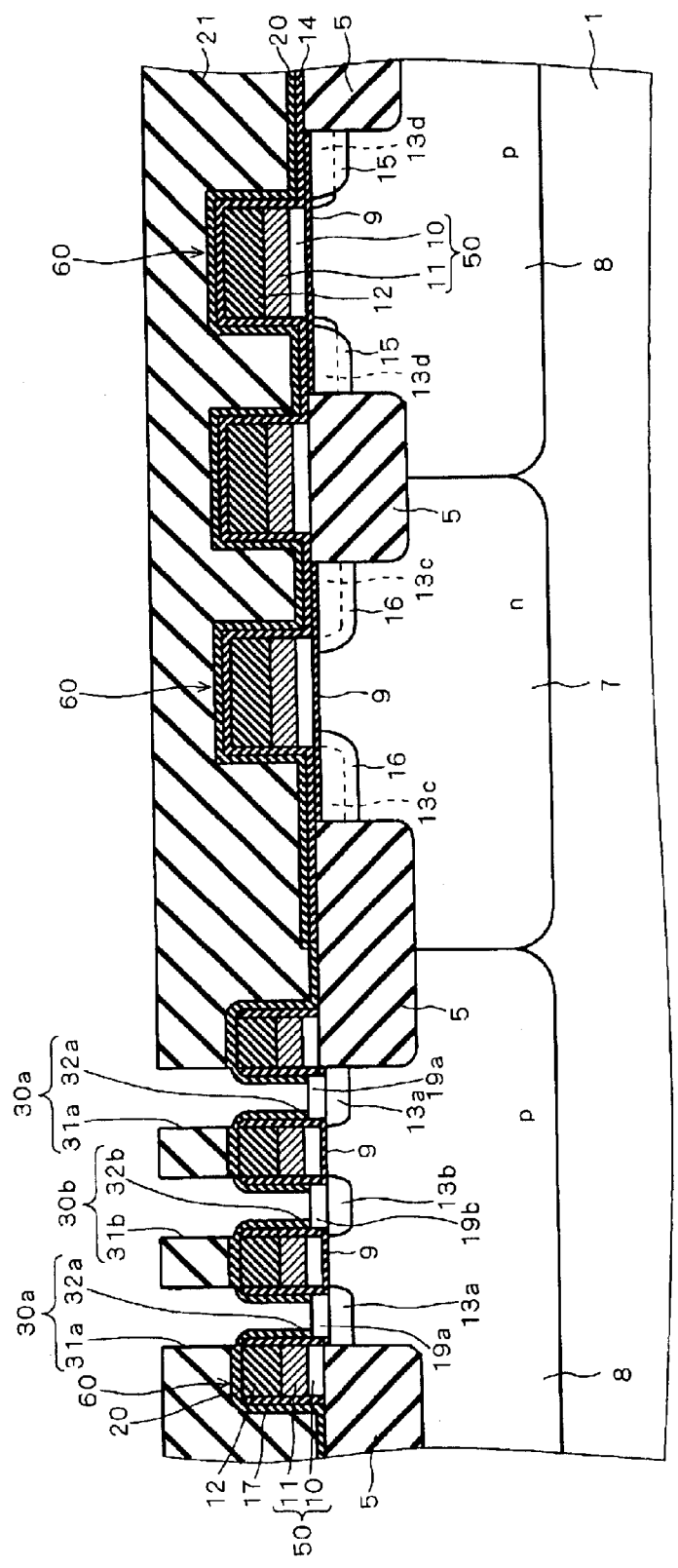
Figure 18:
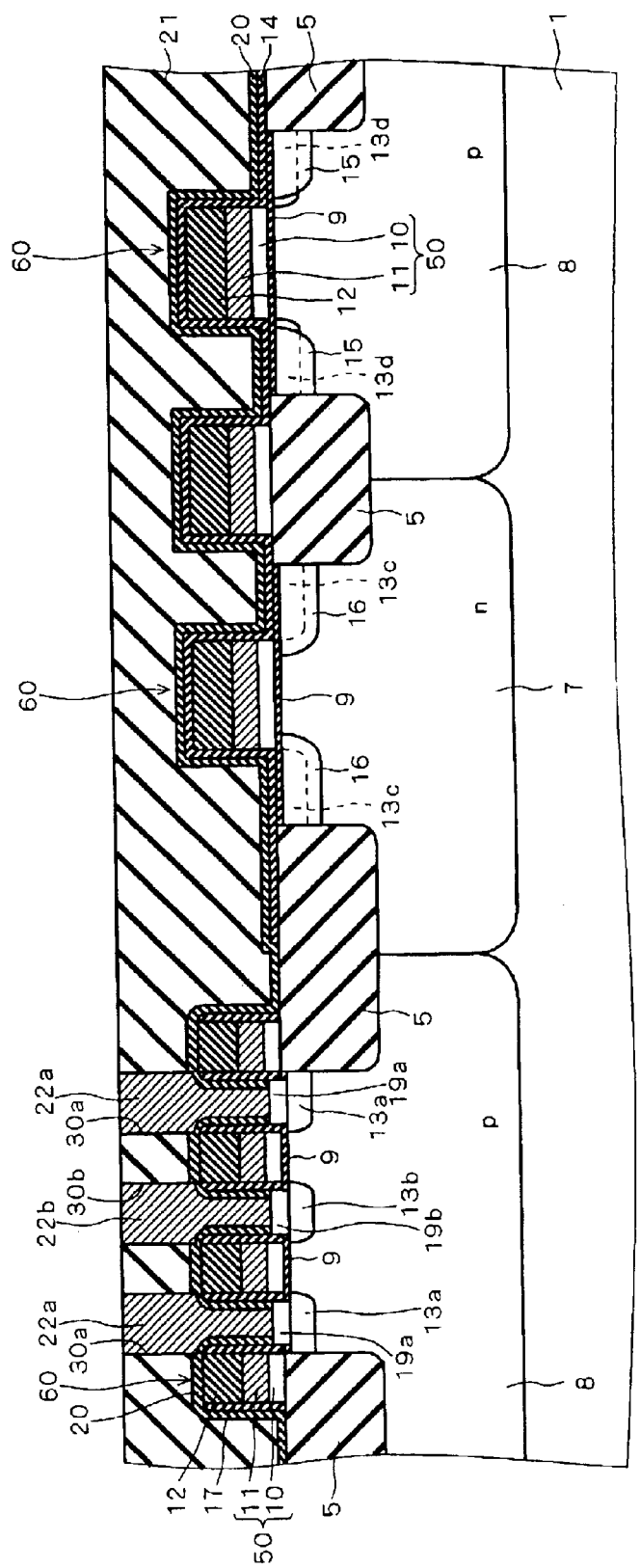

As shown in FIG. 17, next, the etching blocking film 20 exposed by the execution of the step shown in FIG. 16 is subjected to anisotropic etching so that contact holes 32a, each reaching the epitaxial layer 19a, and contact holes 32b, each reaching the epitaxial layer 19b, are formed in the etching blocking film 20. Consequently, contact holes 30a, each consisting of the contact holes 31a and 32a and reaching the epitaxial layer 19a, are completely formed in the interlayer insulating film 21 and the etching blocking film 20. At the same time, contact holes 30b, each consisting of the contact holes 31b and 32b and reaching the epitaxial layer 19b, are completely formed in the interlayer insulating film 21 and the etching blocking film 20. In the present embodiment, maximum diameters of each of the contact holes 30a and 30b is set to be 180 nm, for example. In the present embodiment, moreover, the etching does not reach the semiconductor substrate 1 when the etching blocking film 20 is to be etched. Consequently, it is possible to prevent a damage of the etching from remaining in the semiconductor substrate 1.

As shown in FIG. 18, subsequently, using the CVD method, for example, a polysilicon film is formed on the interlayer insulating film 21 and fills in the contact holes 30a and 30b at the same time. The polysilicon film is doped with an n-type impurity. By the CMP method, for example, the polysilicon film is polished from an upper surface thereof so that the polysilicon film above the contact holes 30a and 30b is removed. Consequently, contact plugs 22a, each formed by the polysilicon film and filling in the contact hole 30a, are finished. At the same time, contact plugs 22b, each formed by the polysilicon film and filling in the contact hole 30b, are finished. The interlayer insulating film 21 functions as a stopper in the polishing for the polysilicon film.

Next, a bit line which is not shown is provided in an electrical connection to the contact plug 22b. Consequently, the bit line and the n-type impurity region 13b functioning as a source/drain region are electrically connected to each other through the contact plug 22b and the epitaxial layer 19b. Moreover, a storage node of a DRAM capacitor which is not shown is provided in an electrical connection to the contact plug 22a. Consequently, the storage node of the capacitor and the n-type impurity region 13a functioning as the source/drain region are electrically connected to each other through the contact plug 22a and the epitaxial layer 19a. Then, a dielectric film and an upper electrode in the capacitor are provided.

Thus, a memory cell transistor having a self-alignment contact structure is formed.

As described above, in the semiconductor device according to the first embodiment, the sidewall insulating film 17 is provided between the gate electrode 50 and the epitaxial layers 19a and 19b, and the etching blocking film 20 is provided on the epitaxial layers 19a and 19b and is interposed between the gate electrode 50 and the contact plugs 22a and 22b. As in the present embodiment, therefore, also in the case in which the etching blocking film 20 is used as an etching stopper in order to prevent the gate electrode 50 from being exposed when the contact holes 30a and 30b are to be formed and in which the thickness of the sidewall insulating film 17 is decreased and the contact areas between the epitaxial layers 19a and 19b and the n-type impurity regions 13a and 13b are increased in order to reduce electric resistances between the contact plugs 22a and 22b and the n-type impurity regions 13a and 13b, it is possible to reliably prevent the gate electrode 50 from being exposed in the formation of the contact holes 30a and 30b by regulating the thickness of the etching blocking film 20. Accordingly, it is possible to reduce electric resistances between the contact plugs 22a and 22b and the n-type impurity regions 13a and 13b to be electrically connected thereto while maintaining an insulating property between the gate electrode 50 and the contact plugs 22a and 22b. As a result, it is possible to eliminate a drawback that a function operation failure is caused by an electrical short circuit between the gate electrode 50 and the contact plugs 22a and 22b and the failure converges with difficulty in burn-in and to provide a semiconductor device which has excellent electrical characteristics and reliability. Contact resistances between the epitaxial layers 19a and 19b and the n-type impurity regions 13a and 13b usually have higher values by one digit than those between the epitaxial layers 19a and 19b and the contact plugs 22a and 22b. Accordingly, even if the thickness of the etching blocking film 20 is increased and the contact areas between the epitaxial layers 19a and 19b and the contact plugs 22a and 22b are decreased in order to prevent an electrical short circuit between the gate electrode 50 and the contact plugs 22a and 22b, the decrease rarely influences electrical resistances between the contact plugs 22a and 22b and the n-type impurity regions 13a and 13b. In other words, the electric resistances between the contact plugs 22a and 22b and the n-type impurity regions 13a and 13b are almost determined by the contact areas between the epitaxial layers 19a and 19b and the n-type impurity regions 13a and 13b.

According to the semiconductor device in accordance with the first embodiment, moreover, the epitaxial layers 19a and 19b are provided between the contact plugs 22a and 22b and the n-type impurity regions 13a and 13b. In the gate structures 60 which are adjacent to each other, the epitaxial layers 19a and 19b are formed over the whole upper surfaces of the n-type impurity regions 13a and 13b interposed between the sidewall insulating film 17 provided on the side surface of one of the gate structures 60 and the sidewall insulating film 17 provided on the side surface of the other gate structure 60 which is opposed to the sidewall insulating film 17 on the side surface of one of the gate structures 60. Accordingly, in the case in which an error is made in an overlay accuracy or a dimensional accuracy in the photolithographic process in the formation of the contact holes 30a and 30b, the contact areas between the epitaxial layers 19a and 19b and the contact plugs 22a and 22b are reduced and those between the epitaxial layers 19a and 19b and the n-type impurity regions 13a and 13b are not changed. Therefore, the electric resistances between the contact plugs 22a and 22b and the n-type impurity regions 13a and 13b are rarely changed. Also in the case in which an error is made in the overlay accuracy or the dimensional accuracy in the photolithographic process in the formation of the contact holes 30a and 30b, consequently, it is possible to prevent generation of a data writing failure to a memory cell of a DRAM and a deterioration in a refresh characteristic.

In the semiconductor device in accordance with the first embodiment, furthermore, the epitaxial layers 19a and 19b are provided between the contact holes 30a and 30b and the n-type impurity regions 13a and 13b. When the contact holes 30a and 30b are to be formed, therefore, the damage of the etching is not induced to the surface of the semiconductor substrate 1. Accordingly, it is possible to prevent the deterioration in the refresh characteristic which is generated by inducing the etching damage to the semiconductor substrate 1.

By grasping the contents related to the first embodiment as the contents related to the method of manufacturing a semiconductor device, moreover, the following is apparent. More specifically, according to the method of manufacturing a semiconductor device in accordance with the first embodiment, also in the case in which the thickness of the sidewall insulating film 17 is decreased in order to reduce the electric resistance between the contact plug 22a and the n-type impurity region 13a or the electric resistance between the contact plug 22b and the n-type impurity region 13b, the thickness of the etching blocking film 20 is regulated so that the gate electrode 50 can be reliably prevented from being exposed when a part of the contact holes 30a and 30b, that is, the contact holes 31a and 31b are to be formed at the step shown in FIG. 16. Accordingly, it is possible to reduce the electric resistances between the contact plugs 22a and 22b and the n-type impurity regions 13a and 13b to be electrically connected thereto while maintaining the insulating property between the gate electrode 50 and the contact plugs 22a and 22b.

According to the method of manufacturing a semiconductor device in accordance with the first embodiment, moreover, the epitaxial layers 19a and 19b are formed in self-alignment and the contact holes 30a and 30b reaching the epitaxial layers 19a and 19b are then formed. Accordingly, in the case in which an error is made in an overlay accuracy or a dimensional accuracy in the photolithographic process in the formation of the contact holes 30a and 30b, the contact areas between the epitaxial layers 19a and 19b and the contact plugs 22a and 22b are reduced and those between the epitaxial layers 19a and 19b and the n-type impurity regions 13a and 13b are not changed. Also in such a case, therefore, the electric resistances between the contact plugs 22a and 22b and the n-type impurity regions 13a and 13b are rarely changed, and it is possible to prevent generation of a data writing failure to a memory cell of a DRAM and a deterioration in a refresh characteristic.

According to the method of manufacturing a semiconductor device in accordance with the first embodiment, furthermore, the epitaxial layers 19a and 19b are present on the n-type impurity regions 13a and 13b when the contact holes 30a and 30b are to be formed. When the contact holes 30a and 30b are to be formed, therefore, the damage of the etching is not induced to the surface of the semiconductor substrate 1. Accordingly, it is possible to prevent the deterioration in the refresh characteristic which is generated by inducing the etching damage to the semiconductor substrate 1.

In the first embodiment, moreover, the epitaxial layers 19a and 19b are provided on the n-type impurity regions 13a and 13b. Consequently, a contact surface with the contact plugs 22a and 22b is raised from the semiconductor substrate 1. For this reason, it is possible to reduce an effective aspect ratio of the contact holes 30a and 30b. Accordingly, it is possible to increase a process margin in the formation of the contact holes 30a and 30b.

In the first embodiment, moreover, the epitaxial layers 19a and 19b are provided on the n-type impurity regions 13a and 13b (first impurity regions). Therefore, it is possible to decrease the aspect ratio of the space between the gate structures 60. Accordingly, it is possible to suppress the generation of the burying failure when filing in the space with the interlayer insulating film 21.

Second Embodiment

Figure 19:
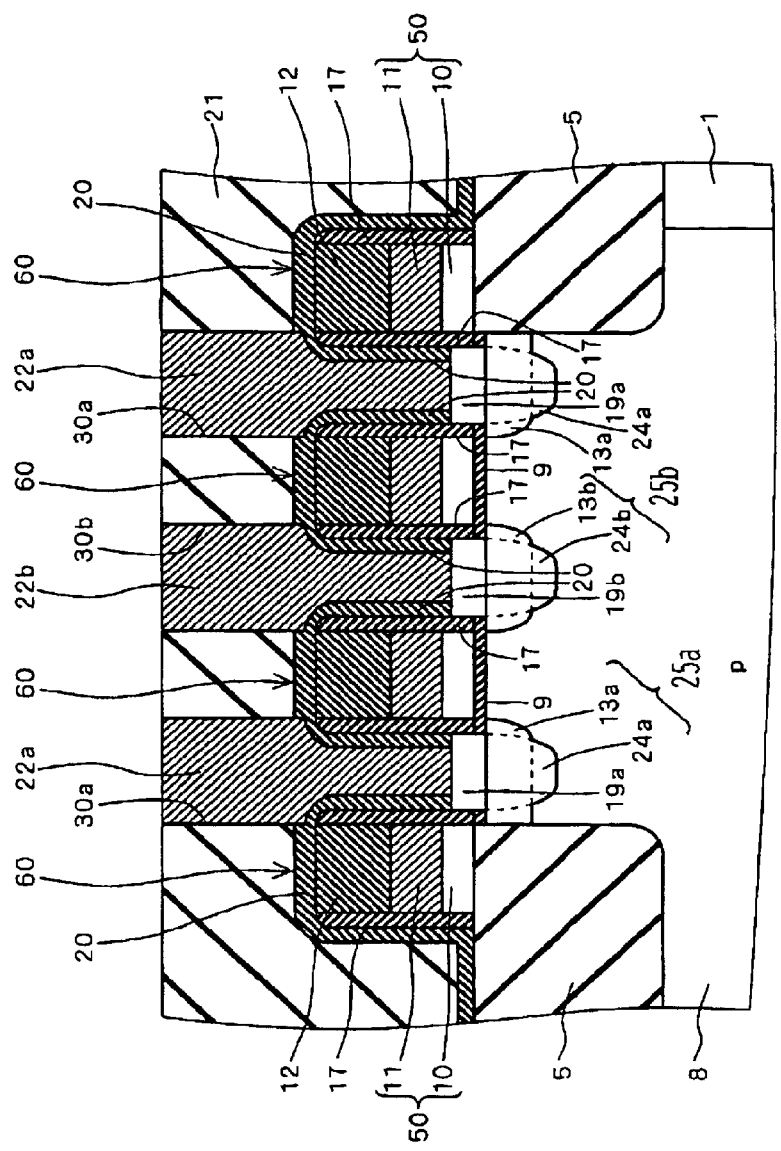
FIG. 19 is a sectional view showing a structure of a semiconductor device according to a second embodiment of the present invention.

FIG. 19 is a sectional view showing a structure of a semiconductor device according to a second embodiment of the present invention. The semiconductor device according to the second embodiment further comprises n-type impurity regions 24a and 24b (third impurity regions) in the upper surface of the p-type well region 8 (second impurity regions) in the semiconductor device according to the first embodiment. The n-type impurity regions 13a and 24a function as one of source/drain regions of a memory cell transistor and the n-type impurity regions 13b and 24b function as the other source/drain region of the memory cell transistor.

As shown in FIG. 19, the n-type impurity region 24a overlaps with the n-type impurity region 13a and is formed more deeply than the n-type impurity region 13a in the upper surface of the p-type well region 8 below a contact plug 22a. Moreover, a width of the n-type impurity region 24a, that is, a dimension of the n-type impurity region 24a in a vertical direction with respect to a direction along the thickness of a semiconductor substrate 1 is smaller than that of the n-type impurity region 13a. An epitaxial layer 19a is provided on a region of the n-type impurity region 13a which overlaps with the n-type impurity region 24a. On the assumption that the n-type impurity region 13a and the n-type impurity region 24a are united into one n-type impurity region 25a, the n-type impurity region 25a has a lower impurity concentration in the vicinity of an interface with the p-type well region 8 than that in the vicinity of an interface with the epitaxial layer 19a.

Moreover, the n-type impurity region 24b overlaps with the n-type impurity region 13b and is formed more deeply than the n-type impurity region 13b in the upper surface of the p-type well region 8 below a contact plug 22b. Furthermore, a width of the n-type impurity region 24b, that is, a dimension of the n-type impurity region 24b in a vertical direction with respect to a direction along the thickness of the semiconductor substrate 1 is smaller than that of the n-type impurity region 13b. An epitaxial layer 19b is provided on a region of the n-type impurity region 13b which overlaps with the n-type impurity region 24b. On the assumption that the n-type impurity region 13b and the n-type impurity region 24b are united into one n-type impurity region 25b, the n-type impurity region 25b has a lower impurity concentration in the vicinity of an interface with the p-type well region 8 than that in the vicinity of an interface with the epitaxial layer 19a. Since other structures of the semiconductor device according to the second embodiment are the same as those of the semiconductor device according to the first embodiment, description thereof will be omitted.

Figure 20:
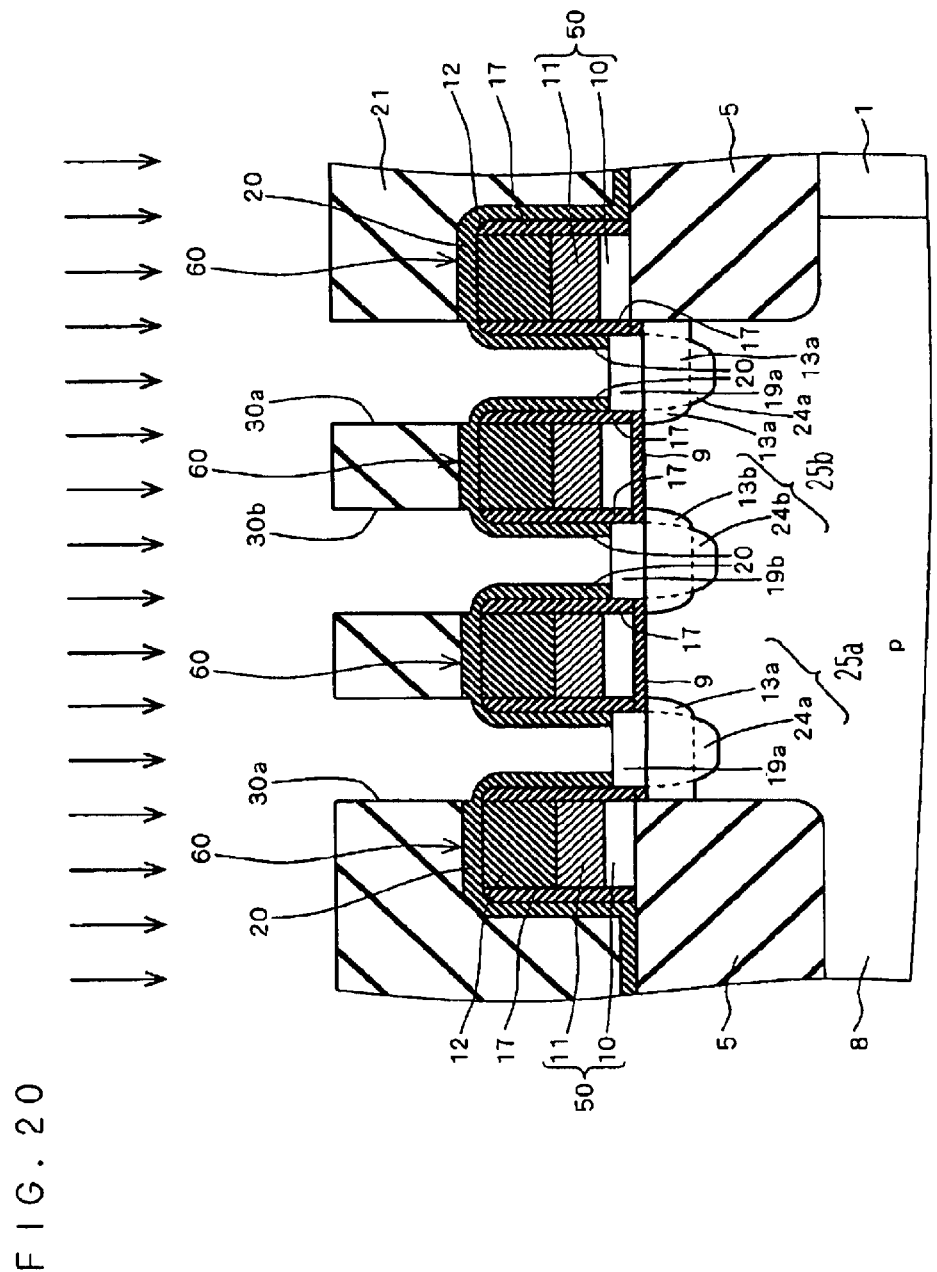
FIG. 20 is a sectional view showing a part of a process for manufacturing the semiconductor device according to the second embodiment of the present invention.

Next, a method of manufacturing the semiconductor device shown in FIG. 19 will be described. FIG. 20 is a sectional view showing a part of a process for manufacturing the semiconductor device in FIG. 19, illustrating an enlarged portion in which a memory cell of a DRAM is formed.

First of all, the steps shown in FIGS. 2 to 17 are executed. As shown in FIG. 20, ion implantation is carried out over a whole surface using an interlayer insulating film 21 as a mask. Consequently, an impurity is introduced into a main surface of a semiconductor substrate 1 through a contact hole 30a and an epitaxial layer 19a, so that an n-type impurity region 24a is formed in self-alignment in an upper surface of a p-type well region 8. As a result, an n-type impurity region 25a having a lower impurity concentration in the vicinity of an interface with the p-type well region 8 than that in the vicinity of an interface with the epitaxial layer 19a is formed in the upper surface of the p-type well region 8. At the same time, an impurity is introduced into the main surface of the semiconductor substrate 1 through a contact hole 30b and an epitaxial layer 19b, so that an n-type impurity region 24b is formed in self-alignment in the upper surface of the p-type well region 8. As a result, an n-type impurity region 25b having a lower impurity concentration in the vicinity of the interface with the p-type well region 8 than that in the vicinity of an interface with the epitaxial layer 19b is formed in the upper surface of the p-type well region 8.

The n-type impurity regions 24a and 24b are obtained by implanting a phosphorus (P) ion in an acceleration energy of 30 keV and a dose of $2\times10^{13}$ cm$^{-2}$, for example.

After the n-type impurity regions 24a and 24b are formed, the step shown in FIG. 18 is executed to form contact plugs 22a and 22b filling in the contact holes 30a and 30b. Then, a bit line and a capacitor are formed.

As described above, in the second embodiment, the impurity concentration in the vicinity of the interface with the epitaxial layer 19a, 19b is higher in an n-type impurity region to be electrically connected to the contact plugs 22a and 22b than that in the first embodiment. Consequently, electric resistances between the contact plugs 22a and 22b and the n-type impurity region can be more reduced than those in the first embodiment. In the n-type impurity region to be electrically connected to the contact plugs 22a and 22b, furthermore, the impurity concentration in the vicinity of the interface with the p-type well region 8 is almost equal to that of the first embodiment. Therefore, it is possible to suppress a rise in an electric field of a PN junction which is generated between the n-type impurity region and the p-type well region 8. More specifically, it is possible to reduce the electric resistances between the n-type impurity region and the contact plugs 22a and 22b while preventing the rise in the electric field which is generated between the n-type impurity region and the p-type well region 8. As a result, it is possible to obtain a semiconductor device having an excellent refresh characteristic.

Third Embodiment

Figure 21:
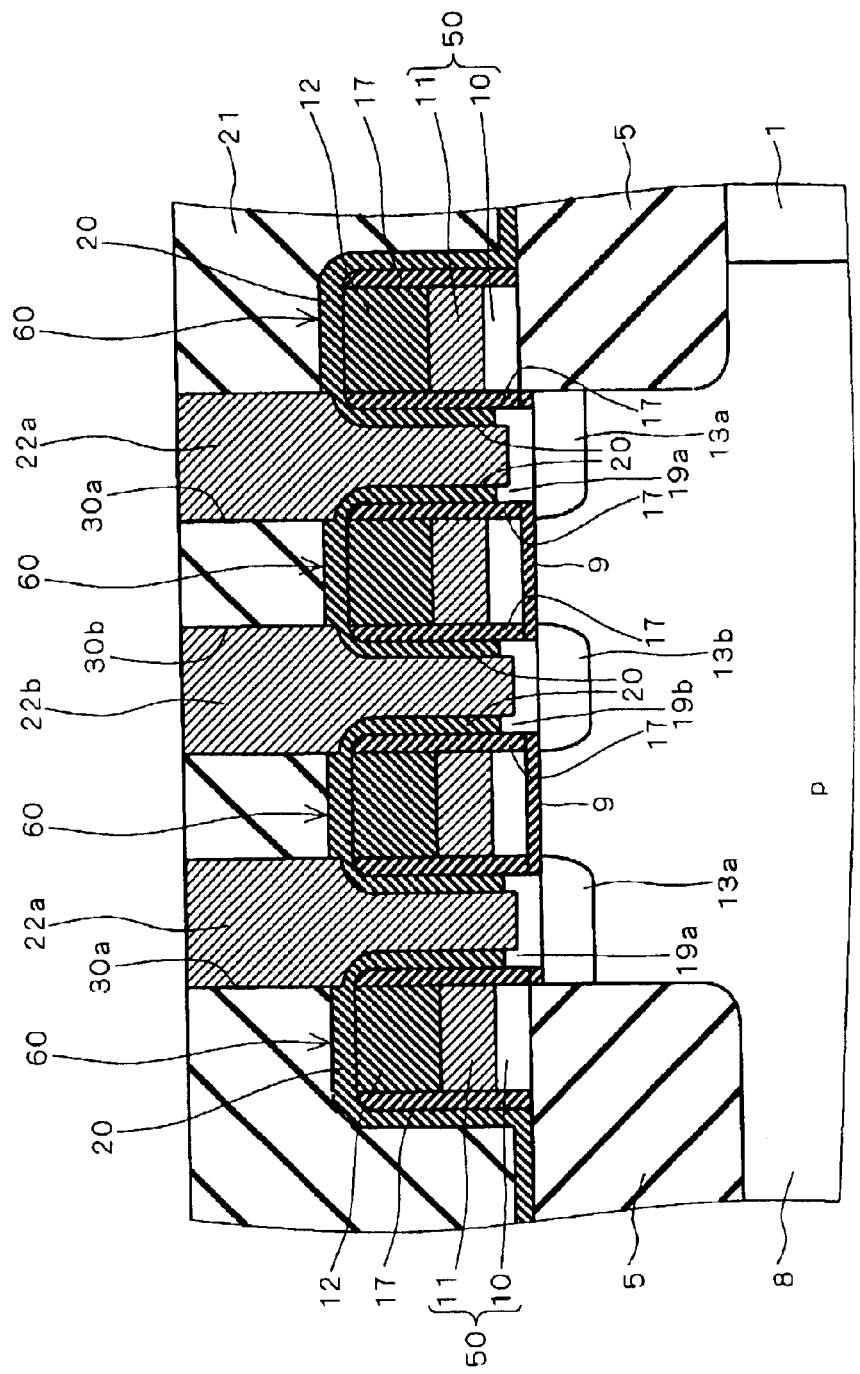
FIG. 21 is a sectional view showing a structure of a semiconductor device according to a third embodiment of the present invention.

FIG. 21 is a sectional view showing a structure of a semiconductor device according to a third embodiment of the present invention. In the semiconductor device according to the third embodiment, a concave portion is formed on each of the upper surfaces of the epitaxial layers 19a and 19b in the semiconductor device according to the first embodiment. More specifically, in the upper surface of the epitaxial layer 19a, a portion provided in contact with a contact plug 22a is more concave than a portion provided in contact with a sidewall insulating film 17. In the upper surface of the epitaxial layer 19b, moreover, a portion provided in contact with the contact plug 22b is more concave than a portion provided in contact with the sidewall insulating film 17. Since other structures arc the same as those of the semiconductor device according to the first embodiment, description thereof will be omitted.

Figure 22:
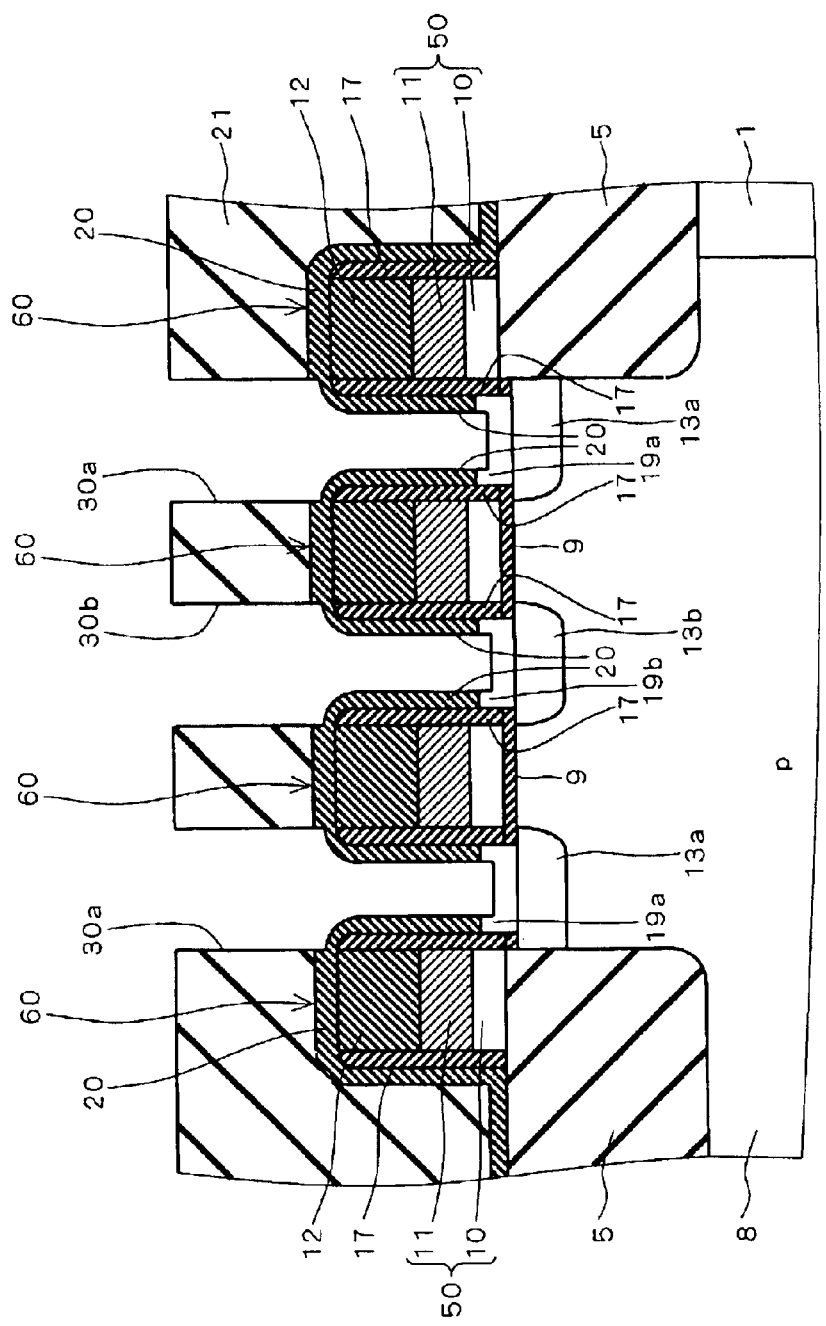
FIG. 22 is a sectional view showing a part of a process for manufacturing the semiconductor device according to the third embodiment of the present invention.

Next, a method of manufacturing the semiconductor device shown in FIG. 21 will be described. FIG. 22 is a sectional view showing a part of a process for manufacturing the semiconductor device in FIG. 21, illustrating an enlarged portion in which a memory cell of a DRAM is formed.

First of all, the steps shown in FIGS. 2 to 17 are executed. As shown in FIG. 22, the exposed upper surfaces of the epitaxial layers 19a and 19b are anisotropically or isotropically removed by 5 to 20 nm in self-alignment by dry etching utilizing CF$_4$ and O$_2$, for example, as shown in FIG. 22. At this time, an interlayer insulating film 21 and an etching blocking film 20 function as etching masks. In the third embodiment, contact holes 30a and 30b are provided including concave portions formed on the upper surfaces of the epitaxial layers 19a and 19b by the execution of the step shown in FIG. 22.

Next, the step shown in FIG. 18 is executed to form contact plugs 22a and 22b filling in the contact holes 30a and 30b, respectively. Then, a bit line and a capacitor are formed.

In the semiconductor device according to the third embodiment, thus, the portions provided in contact with the contact plugs 22a and 22b are more concave than the portions provided in contact with the sidewall insulating film 17 in the upper surfaces of the epitaxial layers 19a and 19b. Consequently, the semiconductor device can be manufactured by the manufacturing method described above. More specifically, the contact holes 30a and 30b are formed and the upper surfaces of the epitaxial layers 19a and 19b are then exposed (see FIG. 17), and the epitaxial layers 19a and 19b are partially removed from the upper surfaces thereof (see FIG. 22) and the contact holes 30a and 30b are thereafter filled with the contact plugs 22a and 22b (see FIG. 18). Thus, the semiconductor device according to the third embodiment can be obtained.

In the case in which the etching blocking film 20 is subjected to anisotropic etching by a dry etching method to expose the upper surfaces of the epitaxial layers 19a and 19b, accordingly, an etching damage layer, a carbon based impurity and a metallic impurity which are generated on the epitaxial layers 19a and 19b can be taken away by partially removing the epitaxial layers 19a and 19b from the upper surfaces thereof. As a result, electric resistances between the contact plugs 22a and 22b and n-type impurity regions 13a and 13b can be more reduced than those of the semiconductor device according to the first embodiment in which the upper surfaces of the epitaxial layers 19a and 19b are not removed partially.

When the epitaxial layers 19a and 19b are to be removed partially, there is employed a dry etching method having a lower energy than that in the case in which the etching blocking film 20 is removed to expose the epitaxial layers 19a and 19b. In the dry etching method having a lower energy, usually, etching is isotropically carried out as in a wet etching method. Therefore, an etching damage is not caused in the epitaxial layers 19a and 19b.

By grasping the contents related to the third embodiment as the contents related to the method of manufacturing a semiconductor device, moreover, the following is apparent. More specifically, according to the method of manufacturing a semiconductor device in accordance with the third embodiment, etching damage layers and the like which are generated on the epitaxial layers 19a and 19b by the execution of the step shown in FIG. 17 can be removed by executing the step shown in FIG. 22. As a result, electric resistances between the contact plugs 22a and 22b and the n-type impurity regions 13a and 13b can be more reduced than those in the method of manufacturing a semiconductor device according to the first embodiment in which the upper surfaces of the epitaxial layers 19a and 19b are not partially removed.

In the second embodiment, it is apparent that the effects of the invention according to the third embodiment can be obtained by adding the step shown in FIG. 22 in addition to the effects of the invention according to the second embodiment. For example, in the second embodiment, the step shown in FIG. 22 is executed between the step shown in FIG. 20 and the step shown in FIG. 18, so that the etching damage layers and the like which are generated on the epitaxial layers 19a and 19b by the execution of the step shown in FIG. 17 can be removed. Consequently, it is possible to obtain a semiconductor device in which portions of the upper surfaces of the epitaxial layers 19a and 19b provided in contact with the contact plugs 22a and 22b are more concave than the portion provided in contact with the sidewall insulating film 17 in the semiconductor device shown in FIG. 19.

Fourth Embodiment

Figure 23:
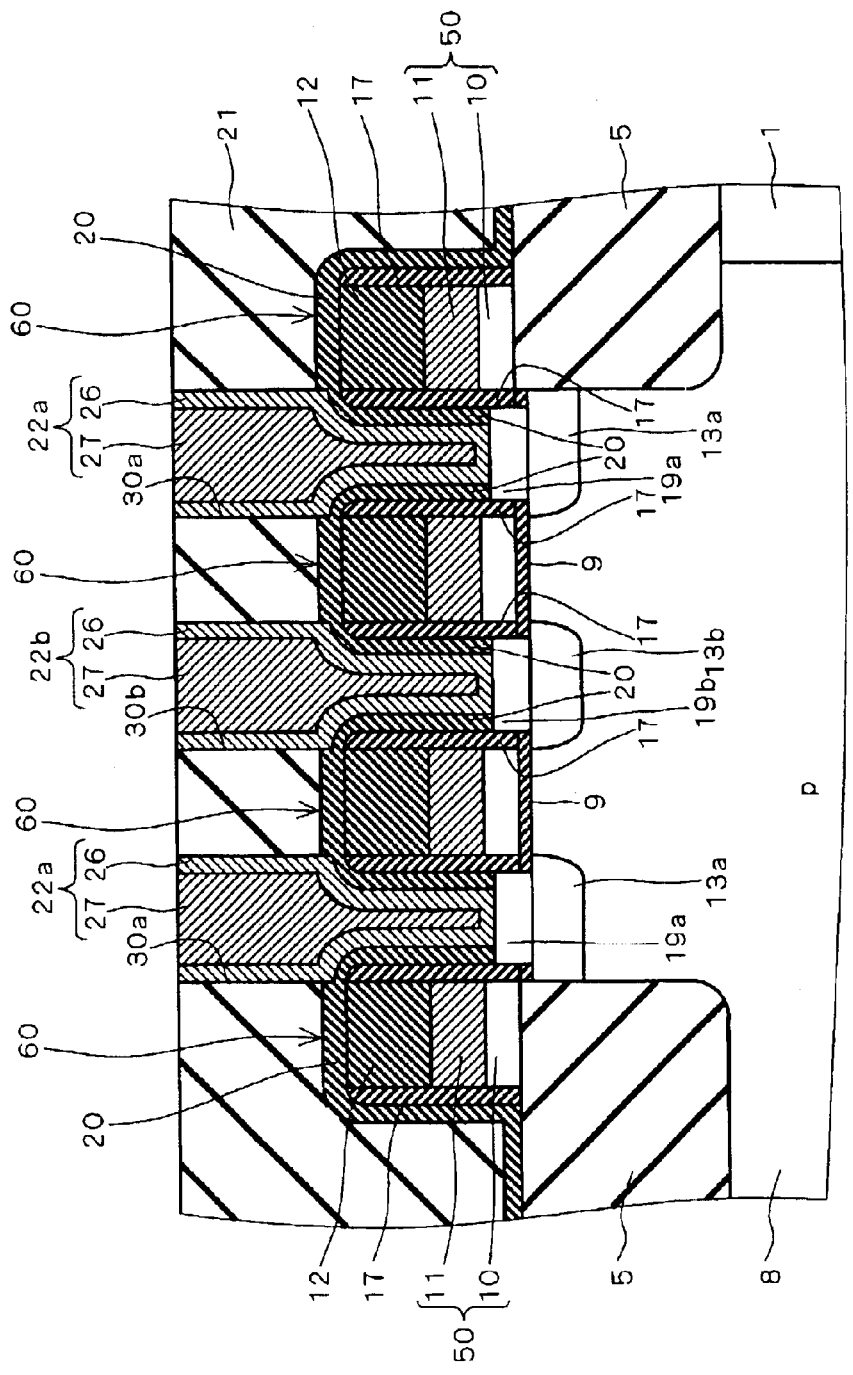
FIG. 23 is a sectional view showing a structure of a semiconductor device according to a fourth embodiment of the present invention.

FIG. 23 is a sectional view showing a structure of a semiconductor device according to a fourth embodiment of the present invention. In the semiconductor device according to the fourth embodiment, each of the contact plugs 22a and 22b is formed by a barrier metal layer 26 and a metal film 27 in place of the polysilicon film in the semiconductor device according to the first embodiment. More specifically, as shown in FIG. 23, the contact plug 22a is formed by the barrier metal layer 26 provided on a surface of a contact hole 30a and an upper surface of an epitaxial layer 19a, and the metal film 27 provided on the barrier metal layer 26. Moreover, the contact plug 22b is formed by the barrier metal layer 26 provided on a surface of a contact hole 30b and an upper surface of an epitaxial layer 19b, and the metal film 27 provided on the barrier metal layer 26.

The barrier metal layer 26 is formed of titanium (Ti) and titanium nitride (TiN), for example, and the metal film 27 is formed of tungsten (W), for example. Since other structures are the same as those of the semiconductor device according to the first embodiment, description thereof will be omitted.

Figure 24:
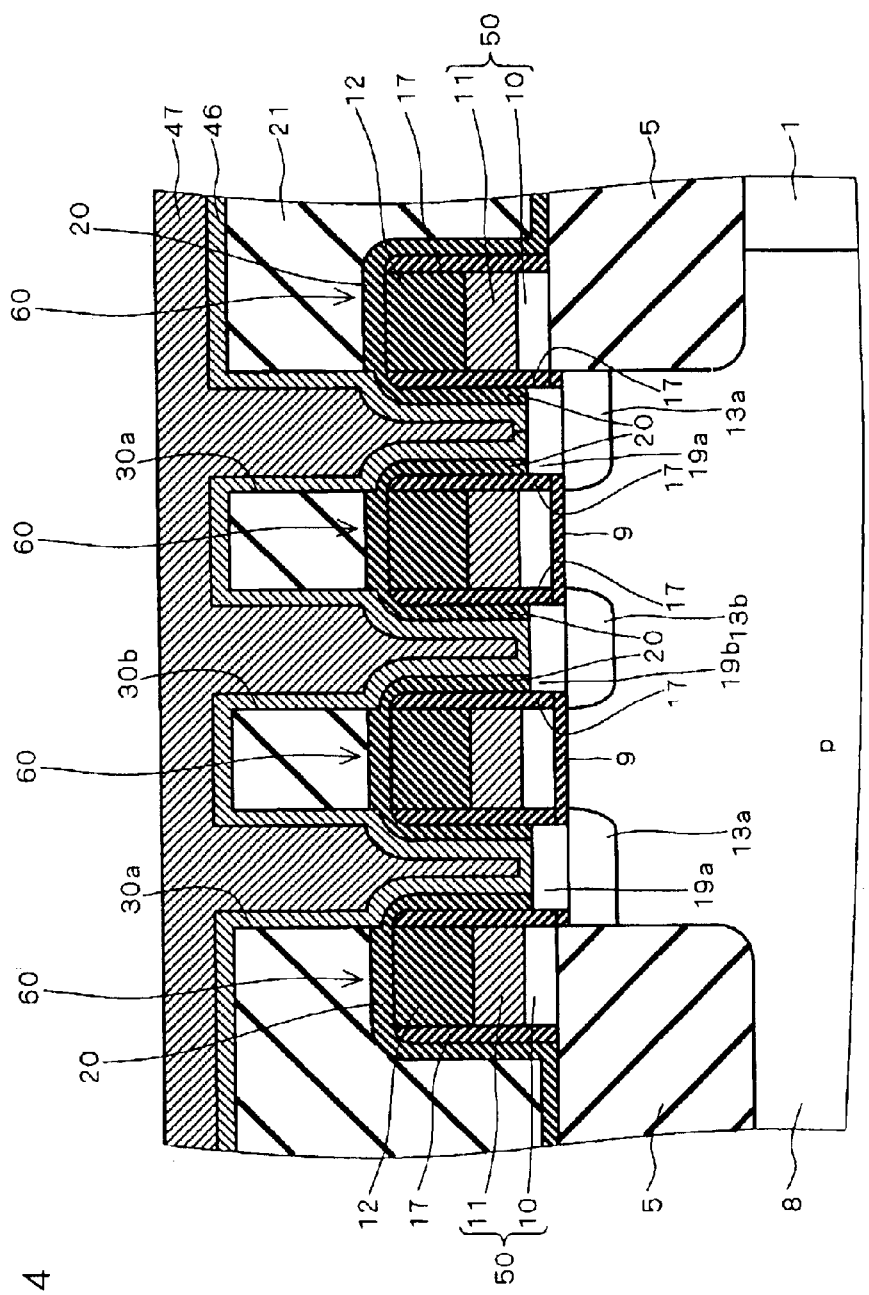
FIG. 24 is a sectional view showing a part of a process for manufacturing the semiconductor device according to the fourth embodiment of the present invention.

Next, description will be given to a method of manufacturing the semiconductor device shown in FIG. 23. FIG. 24 is a sectional view showing a part of a process for manufacturing the semiconductor device in FIG. 23, illustrating an enlarged portion in which a memory cell of a DRAM is formed.

First of all, the steps shown in FIGS. 2 to 17 are executed. In place of the step shown in FIG. 18, a step shown in FIG. 24 is executed. More specifically, as shown in FIG. 24, a titanium film having a thickness of 10 nm and a titanium nitride film having a thickness of 12 nm are formed over a whole surface in this order by a CVD method, for example. Consequently, there is formed a laminated film 46 which consists of titanium and titanium nitride and does not fill in the contact holes 30a and 30b.

Next, a tungsten film 47 having a thickness of 300 nm is formed on the laminated film 46 by the CVD method, for example. Consequently, the contact holes 30a and 30b are filled with the laminated film 46 and the tungsten film 47. Then, the tungsten film 47 and the laminated film 46 are polished from an upper surface of the tungsten film 47 using an interlayer insulating film 21 as a stopper film by a CMP method, for example. Thus, the tungsten film 47 and the laminated film 46 above the contact holes 30a and 30b are removed. As a result, there is obtained the structure shown in FIG. 23 which comprises the contact plugs 22a and 22b having the barrier metal layer 26 formed of titanium and titanium nitride and the metal film 27 formed of tungsten. Thereafter, a bit line and a capacitor are formed.

In the fourth embodiment, thus, the contact plugs 22a and 22b include the metal film 27. Therefore, it is possible to more reduce resistances of the contact plugs 22a and 22b than those in the case in which they are formed by only a polysilicon film as in the first embodiment. As a result, electric resistances between the contact plugs 22a and 22b and n-type impurity regions 13a and 13b can be more reduced than those in the first embodiment.

Moreover, the barrier metal layer 26 is provided between the epitaxial layers 19a and 19b and the metal film 27. Consequently, it is possible to reduce the resistances of the contact plugs 22a and 22b while suppressing a reaction of the epitaxial layers 19a and 19b to the metal film 27.

In each of the second and third embodiments, the step shown in FIG. 24 is executed in place of the step shown in FIG. 18, so that the contact plugs 22a and 22b consisting of the barrier metal layer 26 and the metal film 27 are formed. Consequently, it is apparent that the effects of the invention according to the fourth embodiment can be obtained in addition to the effects of the invention according to the second and third embodiments.

Figure 25:
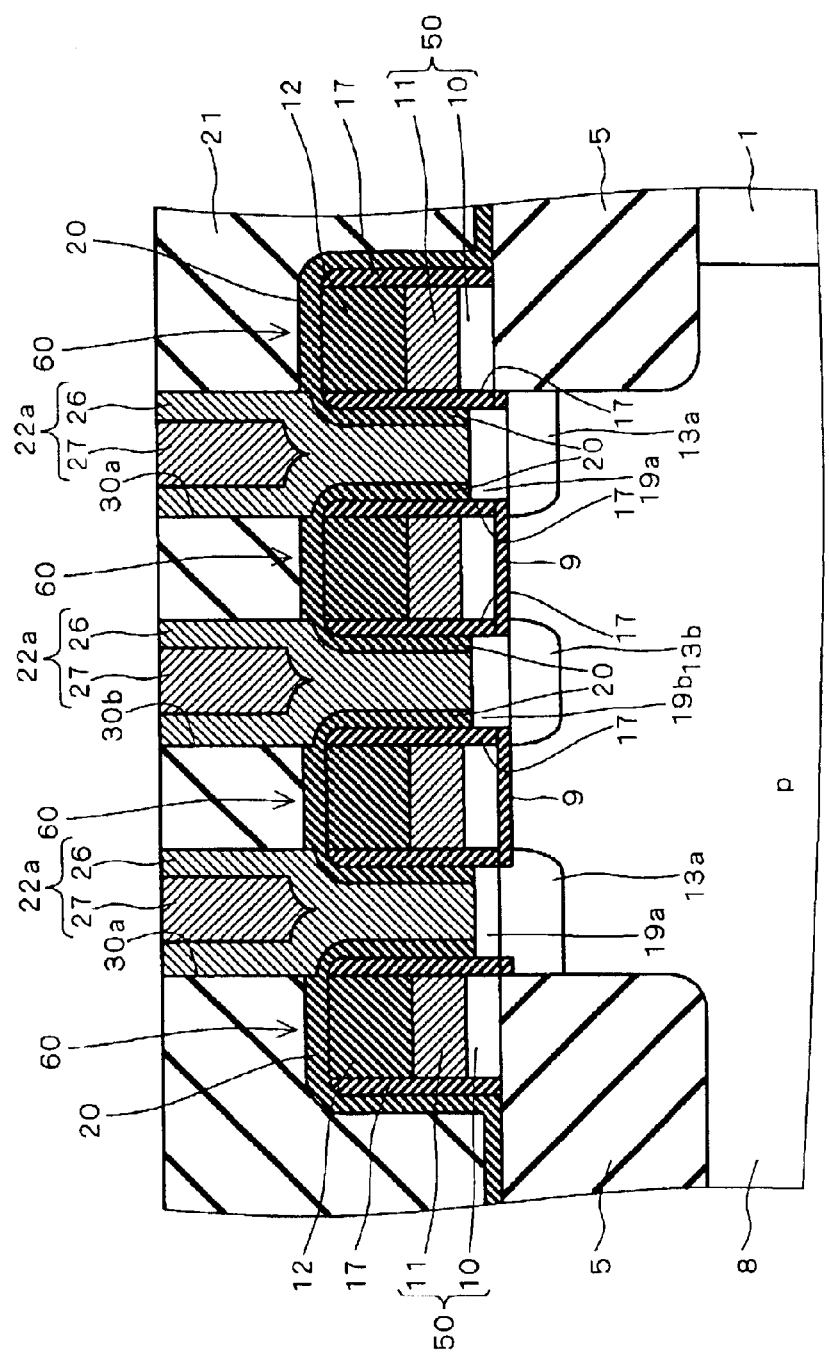
FIG. 25 is a sectional view showing a structure of a semiconductor device according to a variant of the fourth embodiment of the present invention.

As shown in FIG. 25, moreover, it is also possible to increase a thickness of the barrier metal layer 26, thereby filling a space between gate structures 60 with the barrier metal layer 26. A method of manufacturing a semiconductor device shown in FIG. 25 will be described below.

Figure 26:
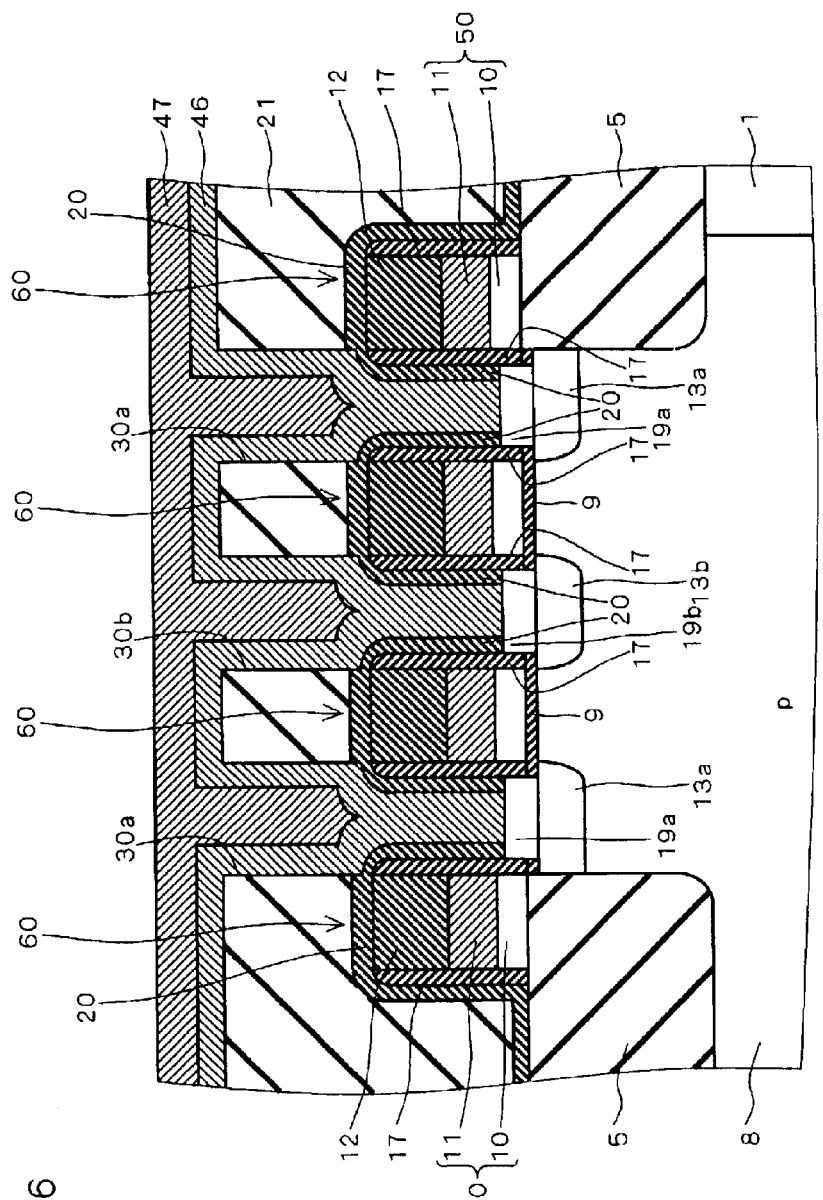
FIG. 26 is a sectional view showing a part of a process for manufacturing the semiconductor device according to the variant of the fourth embodiment of the present invention.

FIG. 26 is a sectional view showing a part of a process for manufacturing the semiconductor device in FIG. 25, illustrating an enlarged portion in which a memory cell of a DRAM is formed. First of all, the steps shown in FIGS. 2 to 17 are executed. In place of the step shown in FIG. 24, a step shown in FIG. 26 is executed. More specifically, as shown in FIG. 26, a titanium film having a thickness of 10 nm and a titanium nitride film having a thickness of 50 nm are formed over a whole surface in this order by a CVD method, for example. Consequently, a laminated film 46 consisting of titanium and titanium nitride and filling in the space between the gate structures 60 is formed. As described in the first embodiment, a distance between gate electrodes 50 is set to be 150 nm and a sidewall insulating film 17, an etching blocking film 20 and the titanium film have thicknesses set to be 15 nm, 20 nm and 10 nm, respectively. By setting a thickness of the titanium nitride film set to be 30 nm or more, consequently, it is possible to obtain the laminated film 46 filling in the space between the gate structures 60 (150 nm/2−(15 nm+20 nm+10 nm)=30 nm).

Next, a tungsten film 47 having a thickness of 300 nm is formed on the laminated film 46 by the CVD method, for example. Consequently, the contact holes 30a and 30b are filled with the laminated film 46 and the tungsten film 47. Then, the tungsten film 47 and the laminated film 46 are polished from an upper surface of the tungsten film 47 using an interlayer insulating film 21 as a stopper film by a CMP method, for example. Thus, the tungsten film 47 and the laminated film 46 above the contact holes 30a and 30b are removed. As a result, there is obtained a structure shown in FIG. 25 which has the contact plugs 22a and 22b in which the barrier metal layer 26 fills in the space between the gate structures 60. Thereafter, a bit line and a capacitor are formed.

When the tungsten film 47 is to be formed, thus, the laminated film 46 to be the barrier metal layer 26 fills in the space between the gate structures 60. Also in the case in which a coverage of the tungsten film 47 is deteriorated, therefore, it is possible to prevent a void from being generated in the contact plugs 22a and 22b. Accordingly, the resistances of the contact plugs 22a and 22b can be reduced and the electric resistances between the contact plugs 22a and 22b and the n-type impurity regions 13a and 13b can be more reduced than those in the case in which the laminated film 46 does not fill in the space between the gate structures 60.

In each of the second and third embodiments, the step shown in FIG. 26 is executed in place of the step shown in FIG. 18, so that the contact plugs 22a and 22b consisting of the metal film 27 and the barrier metal layer 26 filling in the space between the gate structures 60 are formed. Consequently, it is apparent that the above-mentioned effects can be obtained in addition to the effects of the invention according to the second and third embodiments.

Figure 27:
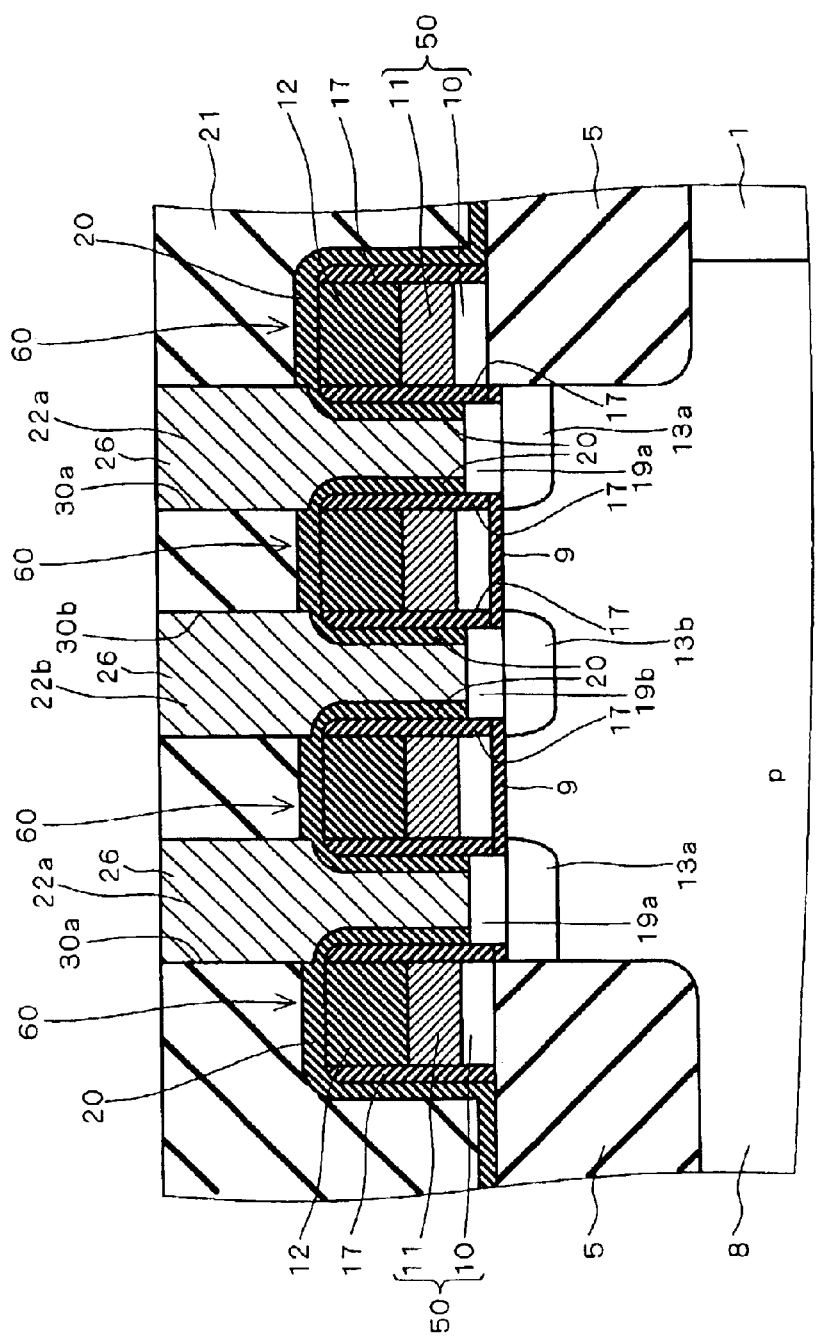
FIG. 27 is a sectional view showing a structure of the semiconductor device according to the variant of the fourth embodiment of the present invention.

As shown in FIG. 27, moreover, each of the contact plugs 22a and 22b may be formed by only the barrier metal layer 26. In other words, each of the contact plugs 22a and 22b may be formed by a laminated film consisting of titanium and titanium nitride. A method of manufacturing a semiconductor device shown in FIG. 27 will be described below.

Figure 28:
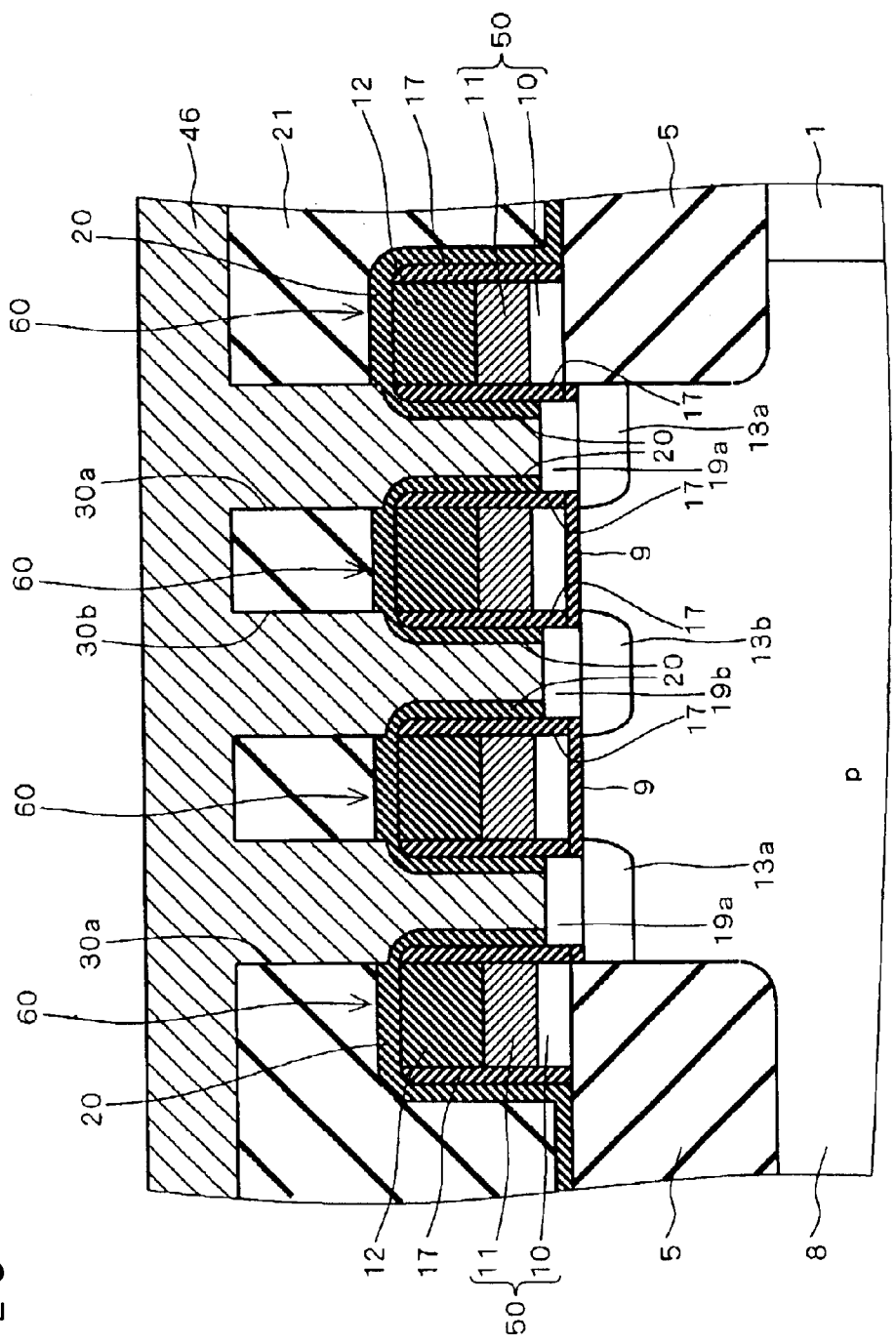
FIG. 28 is a sectional view showing a part of the process for manufacturing the semiconductor device according to the variant of the fourth embodiment of the present invention.
Figure 29:
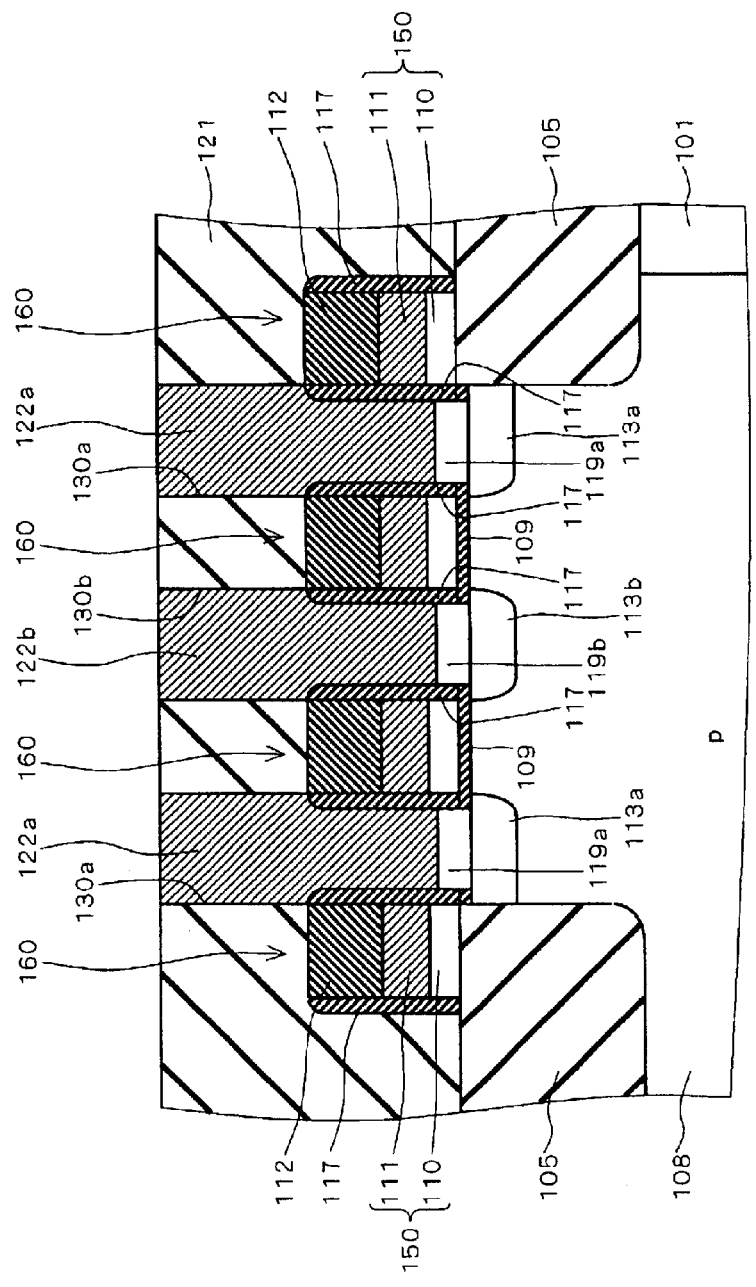
FIG. 29 is a sectional view showing a structure of a conventional semiconductor device.

FIG. 28 is a sectional view showing a part of a process for manufacturing the semiconductor device in FIG. 27, illustrating an enlarged portion in which a memory cell of a DRAM is formed. First of all, the steps shown in FIGS. 2 to 17 are executed. In place of the step shown in FIG. 24, a step shown in FIG. 28 is executed. More specifically, as shown in FIG. 28, a titanium film having a thickness of 10 nm and a titanium nitride film having a thickness of 100 nm are formed over a whole surface in this order by the CVD method, for example. Consequently, a laminated film 46 consisting of titanium and titanium nitride and filling in the contact holes 30a and 30b is formed. As described in the first embodiment, maximum diameters of the contact holes 30a and 30b are set to be 180 nm and a thickness of the titanium film is set to be 10 nm. By setting a thickness of the titanium nitride film set to be 80 nm or more, consequently, it is possible to obtain the laminated film 46 filling in the contact holes 30a and 30b (180 nm/2−10 nm=80 nm).

After the formation of the laminated film 46, the laminated film 46 is polished from an upper surface thereof using the interlayer insulating film 21 as a stopper film by the CMP method, for example. Consequently, the laminated film 46 above the contact holes 30a and 30b is removed. As a result, there is obtained a structure shown in FIG. 27 which has the contact plugs 22a and 22b formed by only the barrier metal layer 26. Thereafter, a bit line and a capacitor are formed.

Thus, each of the contact plugs 22a and 22b is formed by only the barrier metal layer 26. Therefore, the resistances of the contact plugs 22a and 22b can be more reduced than those in the case in which they are formed by only the polysilicon film as in the first embodiment, and furthermore, a material cost of the semiconductor device can be more reduced than that in the case in which the metal film 27 consisting of tungsten is included.

Moreover, the titanium nitride film has a more excellent coverage than that of the tungsten film. Therefore, it is possible to reduce the generation of a void in the contact plugs 22a and 22b.

In each of the second and third embodiments, the step shown in FIG. 28 is executed in place of the step shown in FIG. 18, so that the contact plugs 22a and 22b consisting of only the barrier metal layer 26 are formed. Consequently, it is apparent that the above-mentioned effects can be obtained in addition to the effects of the invention according to the second and third embodiments.

In the first to fourth embodiments, moreover, the etching blocking film 20 is provided on the side part of the gate electrode 50 through the sidewall insulating film 17. In the present invention, the insulating property between the gate electrode 50 and the contact plugs 22a and 22b is maintained by the etching blocking film 20. Therefore, it is sufficient that the sidewall insulating film 17 is provided between the epitaxial layers 19a and 19b and the gate electrode 50 and does not need to be provided between the gate electrode 50 and the contact plugs 22a and 22b. Consequently, even if the etching blocking film 20 is directly provided on the side surface of the gate electrode 50, for example, the effects of the present invention are not influenced.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) preparing a semiconductor substrate having a first impurity region exposed in a main surface and having, on said main surface, a gate structure including a gate electrode provided with a first insulating film on a side part thereof;
   (b) forming an epitaxial layer on said first impurity region so that said first insulating film lies between said epitaxial layer and said gate electrode;
   (c) forming a second insulating film on a side part of said gate electrode and a whole upper surface of said epitaxial layer;
   (d) forming an interlayer insulating film on an upper surface of a structure obtained by execution of said step (c);
   (e) etching said interlayer insulating film using said second insulating film as an etching stopper, thereby forming, in said interlayer insulating film, a first contact hole reaching said second insulating film provided on said epitaxial layer, said second insulating film lying between said gate electrode and said first contact hole;
   (f) etching said second insulating film exposed by execution of said step (e), thereby forming a second contact hole reaching said epitaxial layer in said second insulating film; and
   (g) forming a contact plug to fill in said first and second contact holes.

2. The method of manufacturing a semiconductor device according to claim 1, wherein said semiconductor substrate prepared at said step (a) further has a second impurity region of a different conductivity type from that of said first impurity region in said main surface, and
   said first impurity region is provided in said second impurity region,
   the method further comprising the step of:
   (h) introducing an impurity in said main surface of said semiconductor substrate through said first and second contact holes and said epitaxial layer after said step (f) and before said step (g), thereby forming, in an upper surface of said second impurity region, a third impurity region which has the same conductivity type as that of said first impurity region and is deeper than said first impurity region.

3. The method of manufacturing a semiconductor device according to claim 1, further comprising the step of:
   (i) partially removing said epitaxial layer exposed by execution of said step (f) from an upper surface thereof after said step (f) and before said step (g).

4. The method of manufacturing a semiconductor device according to claim 1, wherein said step (g) includes the step of:
   (g-1) forming a metal film in said first and second contact holes.

5. The method of manufacturing a semiconductor device according to claim 4, wherein said step (g) further includes the step of:
   (g-2) forming a barrier metal layer on said upper surface of said epitaxial layer before said step (g-1),
   said metal film being formed on said barrier metal layer at said step (g-1).

* * * * *